US008004150B2

(12) United States Patent
Adachi et al.

(10) Patent No.: US 8,004,150 B2
(45) Date of Patent: Aug. 23, 2011

(54) ULTRASONIC ACTUATOR WITH FLEXIBLE CABLE CONNECTION MEMBER

(75) Inventors: Yusuke Adachi, Osaka (JP); Hironori Honsho, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/794,076

(22) Filed: Jun. 4, 2010

(65) Prior Publication Data

US 2010/0237743 A1 Sep. 23, 2010

Related U.S. Application Data

(63) Continuation of application No. PCT/JP2008/003629, filed on Dec. 5, 2008.

(30) Foreign Application Priority Data

Dec. 6, 2007 (JP) ................................ 2007-315630

(51) Int. Cl.
*H01L 41/08* (2006.01)

(52) U.S. Cl. .............................. 310/323.02; 310/323.16

(58) Field of Classification Search ............. 310/323.02, 310/323.16
See application file for complete search history.

(56) References Cited

U.S. PATENT DOCUMENTS 6,081,063 A 6/2000 Kasuga et al.
7,061,159 B2 * 6/2006 Funakubo ................ 310/323.02
7,075,211 B1 7/2006 Ganor et al.
7,449,814 B2 * 11/2008 Kasai et al. .............. 310/323.02
7,592,738 B2 * 9/2009 Funakubo ................ 310/323.16
7,635,940 B2 * 12/2009 Ue et al. ................... 310/316.02
7,759,840 B2 * 7/2010 Funakubo et al. ....... 310/323.16
7,834,517 B2 * 11/2010 Sakamoto ................ 310/323.02
2008/0179996 A1 7/2008 Adachi
2008/0278033 A1 * 11/2008 Adachi et al. ................. 310/317

(Continued)

FOREIGN PATENT DOCUMENTS

JP 2000-295876 10/2000

(Continued)

OTHER PUBLICATIONS

International Search Report for corresponding International Application No. PCT/JP2008/003629 mailed Mar. 3, 2009.

(Continued)

*Primary Examiner* — Jaydi San Martin
(74) *Attorney, Agent, or Firm* — Renner, Otto, Boisselle & Sklar, LLP

(57) ABSTRACT

An ultrasonic actuator may be provided in which generation of a stress is prevented in the connection face of the piezoelectric element between the electrodes and the conductive members. The ultrasonic actuator includes a piezoelectric element (P1) and flexible cables (F1). The piezoelectric element (P1) includes: a piezoelectric layer (1); a power supply electrode (2) provided on a principal surface of the piezoelectric layer (1); a counter electrode (3) provided to face the power supply electrode (2) with the piezoelectric layer (1) interposed therebetween; a power supply external electrode (4) which is provided on a short-side surface of the piezoelectric element (P1), and is electrically coupled to the power supply electrode (2); and a counter external electrode (5) which is provided on a short-side surface of the piezoelectric element (P1), and is electrically coupled to the counter electrode (3). The flexible cables (F1) include a first flexible cable (F11) connected to the power supply external electrode (4), and a second flexible cable (F12) connected to the counter external electrode (5).

7 Claims, 21 Drawing Sheets

U.S. PATENT DOCUMENTS

| | | | |
|---|---|---|---|
| 2009/0021114 | A1 | 1/2009 | Adachi |
| 2009/0072665 | A1 | 3/2009 | Adachi et al. |
| 2009/0091213 | A1 | 4/2009 | Adachi |

FOREIGN PATENT DOCUMENTS

| | | |
|---|---|---|
| JP | 2003-501988 | 1/2003 |
| JP | 2005-295656 | 10/2005 |
| JP | 2007-173456 | 7/2007 |
| JP | 2007-300798 | 11/2007 |
| JP | 2007-306800 | 11/2007 |
| JP | 2007-312600 | 11/2007 |
| JP | 2007-318997 | 12/2007 |
| JP | 2008-167651 | 7/2008 |
| JP | 2008-220030 | 9/2008 |

OTHER PUBLICATIONS

Form PCT/ISA/237 for International Application No. PCT/JP2008/003629 dated Mar. 3, 2009.

Notice of Reasons for Rejection for corresponding Japanese Application No. 2009-527639 mailed Feb. 23, 2010 and English translation.

* cited by examiner

ULTRASONIC ACTUATOR WITH FLEXIBLE CABLE CONNECTION MEMBER

CROSS-REFERENCE TO RELATED APPLICATIONS

This application is a continuation of PCT International Patent Application No. PCT/JP2008/003629 filed on Dec. 5, 2008, which claims priority of Japanese Patent Application No. 2007-315630 filed on Dec. 6, 2007, the entire contents of which are expressly incorporated by reference herein.

BACKGROUND

The present invention relates to an ultrasonic actuator which includes a piezoelectric element.

Conventionally, an ultrasonic actuator is known which includes a piezoelectric element (electromechanical conversion element) for use in various electric devices and other types of devices (e.g., see Patent Document 1). This piezoelectric element is formed by alternately stacking piezoelectric bodies and electrodes. In the ultrasonic actuator, voltages are applied to the electrodes to cause the piezoelectric element to vibrate, whereby a movable element is moved.

Another ultrasonic actuator is known in which the piezoelectric element is energized to generate the first vertical vibration in a driving direction and the second bending direction in a direction perpendicular to the driving direction so that a vibrator provided in the piezoelectric element make an orbital movement which is a synthesis of the vertical vibration and the bending vibration, whereby a movable element is moved (e.g., see Patent Document 2).

To apply voltages to the electrodes of the piezoelectric element, the electrodes are connected to conductive members.

Patent Document 1: Japanese Laid-Open PCT National-Phase Publication No. 2003-501988

Patent Document 2: Japanese Laid-Open Patent Publication No. 2000-295876

SUMMARY

In the piezoelectric element described in Patent Document 1, the electrodes and the conductive members are connected in a plane which is perpendicular to a surface of a piezoelectric body provided with the electrodes and which is parallel to the long sides of the surface of the piezoelectric body provided with the electrodes. Vibration of the piezoelectric element deforms the connection face and generates a stress therein. As a result, the connected portion between the electrodes and the conductive members is subjected to a stress, and there is a probability that peeling of the connection face occurs.

In the piezoelectric element described in Patent Document 2, the electrodes and the conductive members are connected on a surface of the piezoelectric element on which the electrodes are provided. Vibration of the piezoelectric element deforms the connection face and generates a stress therein. As a result, the connected portion between the electrodes and the conductive members is subjected to a stress, and there is a probability that peeling of the connection face occurs.

An object of the disclosed technology may be to provide an ultrasonic actuator in which generation of a stress is prevented in the connection face of the piezoelectric element between the electrodes and the conductive members.

The above-described object is accomplished by an ultrasonic actuator which includes the following elements. The ultrasonic actuator includes a piezoelectric element and an electric connection member electrically connected to the piezoelectric element. The piezoelectric element includes: a plurality of generally rectangular piezoelectric layers; a power supply electrode provided on a principal surface of at least one of the plurality of piezoelectric layers; a counter electrode provided to face the power supply electrode with the piezoelectric layer interposed therebetween; a power supply external electrode provided on one of external surfaces of the piezoelectric element which is perpendicular to the principal surface of the piezoelectric layer and which is parallel to short sides of the principal surface, the power supply external electrode being electrically coupled to the power supply electrode; and a counter external electrode provided on one of the external surfaces of the piezoelectric element which is perpendicular to the principal surface of the piezoelectric layer and which is parallel to the short sides of the principal surface, the counter external electrode being electrically coupled to the counter electrode. The electric connection member includes a power supply conductive member electrically connected to the power supply external electrode, and a counter conductive member electrically connected to the counter external electrode.

The disclosed technology may provide an ultrasonic actuator in which generation of a stress is prevented in the connection face of the piezoelectric element between the electrodes and the conductive members.

DESCRIPTION OF REFERENCE CHARACTERS

Figure 1:
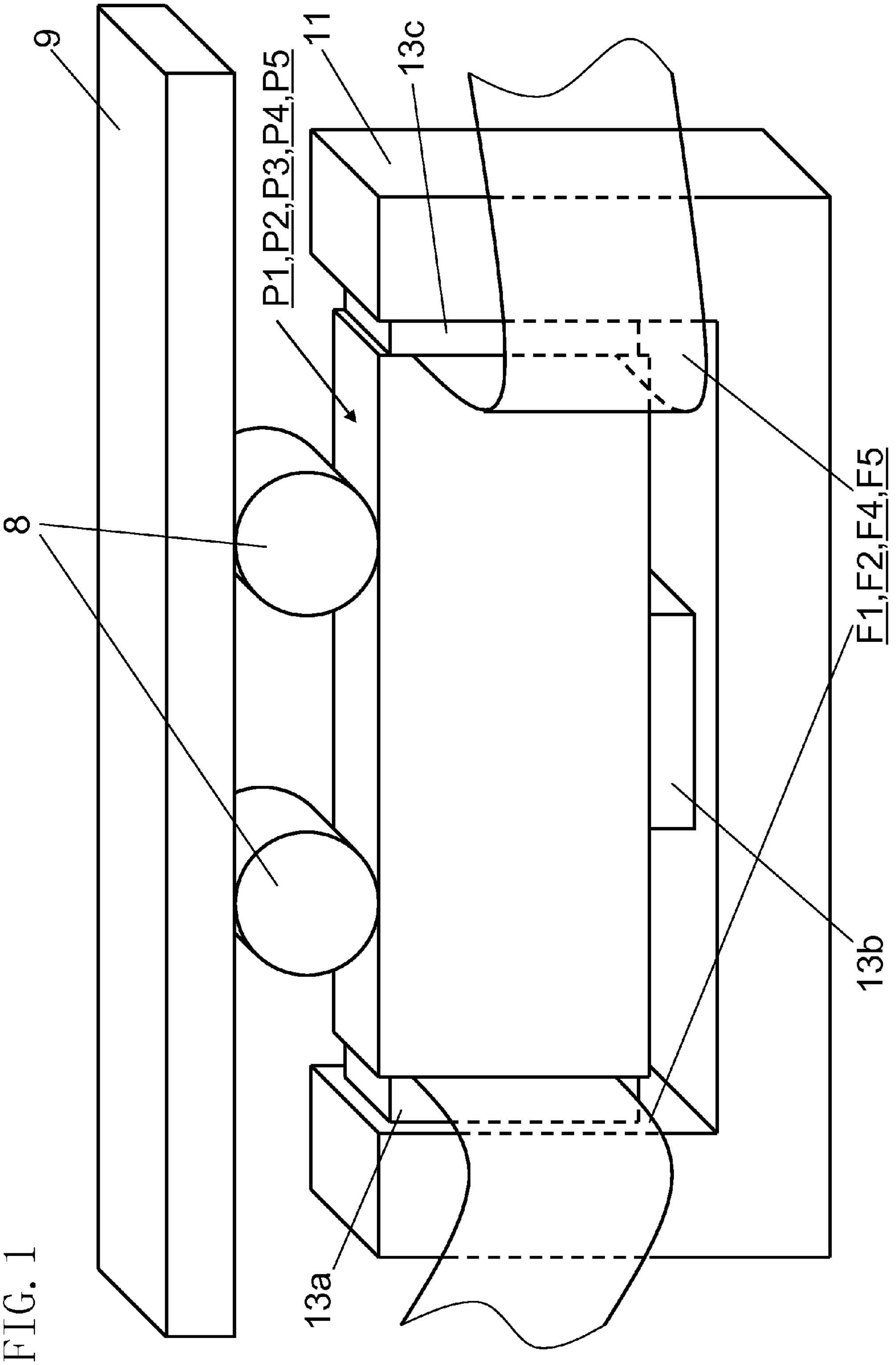
FIG. 1 is a general perspective view of an ultrasonic actuator according to embodiment 1.

P1, P2, P3, P4, P5 piezoelectric element
F1, F2, F4, F5 flexible cable (electrical connection member)
F11, F21, F41, F51 first flexible cable (first electrical connection member)
F12, F22, F42, F52 second flexible cable (second electrical connection member)
1 piezoelectric layer
2 power supply electrode
2A first power supply electrode
2B second power supply electrode
2*a* first power supply lead electrode
2*b* second power supply lead electrode
3 counter electrode
3*g* counter lead electrode
3A first counter electrode
3B first counter electrode
3*a* first counter lead electrode
3*b* second counter lead electrode
4 power supply external electrode
4A first power supply external electrode
4B second power supply external electrode
5 counter external electrode
5A first counter external electrode
5B second counter external electrode
6 electric line (power supply conductive member)
6A electric line (first power supply conductive member)
6B electric line (second power supply conductive member)
7 electric line (counter conductive member)
7A electric line (first counter conductive member)
7B electric line (second counter conductive member)
8 driver element
9 movable element
J1 first connection electrode
J2 second connection electrode
J3 third connection electrode
J4 fourth connection electrode
10A first connection external electrode
10B second connection external electrode
10C third connection external electrode
10D fourth connection external electrode
11 case
13*a*, 13*b*, 13*c* supporting portion

DETAILED DESCRIPTION

Hereinafter, embodiments are described in detail with reference to the drawings. Note that, in the description of the embodiments, elements with the same reference character are identical elements. The description of the elements provided with the same reference character is sometimes omitted.

Embodiment 1

FIG. 1 is a general perspective view of a drive unit according to this embodiment. The drive unit of this embodiment includes an ultrasonic actuator, a movable element 9 which is actuated in a predetermined movable direction by the ultrasonic actuator, and a drive power supply (not shown) configured to control the ultrasonic actuator.

1.1: General Configuration of Ultrasonic Actuator

The ultrasonic actuator of this embodiment includes a piezoelectric element P1, driver elements 8 provided to the piezoelectric element P1, a case 11 containing the piezoelectric element P1, supporting portions 13*a*-13*c* supporting the piezoelectric element P1 on the case 11, and flexible cables F1 for powering the piezoelectric element P1. Generation of stretching vibration and bending vibration in the piezoelectric element P1 causes generation of relative driving force between the piezoelectric element P1 and the movable element 9.

As shown in FIG. 1, the ultrasonic actuator includes the piezoelectric element P1 which is in the shape of a generally rectangular parallelepiped (for example, length 6.0 mm×width 1.7 mm×thickness 2.0 mm). The piezoelectric element P1 includes piezoelectric layers and electrode layers which are stacked in the direction perpendicular to the plane of FIG. 1. In FIG. 1, the anterior surface of the piezoelectric element P1 in the drawing sheet is a principal surface of the piezoelectric layer 1. Hereinafter, a pair of opposite principal surfaces of the piezoelectric layer are referred to as "principal surfaces". A pair of opposite surfaces which are perpendicular to the principal surfaces and which are parallel to the long sides of the principal surfaces are referred to as "long-side surfaces". A pair of opposite surfaces which are perpendicular to the principal surfaces and which are parallel to the short sides of the principal surfaces are referred to as "short-side surfaces". The principal surfaces, the long-side surfaces and the short-side surfaces constitute the outer surfaces of the piezoelectric element P1. The long-side surfaces and the short-side surfaces constitute the circumferential surfaces of the piezoelectric element P1. In this embodiment, among the principal surfaces, the long-side surfaces and the short-side surfaces, the principal surfaces have the largest area. In this embodiment, the piezoelectric element P1 forms a vibrator.

The piezoelectric element P1 is contained in the case 11 which is a supporting body. The piezoelectric element P1 is supported on the case 11 via three supporting portions 13*a*, 13*b* and 13*c*. All of the three supporting portions 13*a*, 13*b* and 13*c* are elastic. The supporting portions 13*a* and 13*c* are compressed in the gaps between the two short-side surfaces and the case 11. In this way, the piezoelectric element P1 is supported by the supporting portions 13*a* and 13*c* in the long-side direction of the principal surface.

The two short-side surfaces of the piezoelectric element P1 are electrically connected to electrical connection members.

One of the long-side surfaces of the piezoelectric element P1 is provided with the driver elements 8, and the driver elements 8 are in contact with the movable element 9 which is in the shape of a flat plate. Specifically, the driver elements 8 are fixed to part of the piezoelectric element P1 near the antinode of the second mode bending vibration, which will be described later. The driver elements 8 are in the shape of a circular pole and are in line contact with the piezoelectric element P1. The driver elements 8 and the piezoelectric element P1 are fixed together by an adhesive. The adhesive used is softer than the piezoelectric layer 1 and the driver elements 8. The softness can be compared by, for example, the modulus of elasticity. The driver elements 8 and part of the movable element 9 which is in contact with the driver elements 8 are formed of a ceramic material containing, e.g., zirconia, alumina, silicon nitride as main constituents, or a resin material.

The supporting portion 13*b* is provided between the other long-side surface of the piezoelectric element P1, i.e., a long-side surface opposite to the long-side surface on which the driver elements 8 are provided, and the case 11. The supporting portion 13*b* is compressed along a direction toward the movable element 9 (the lateral direction of the piezoelectric element P1). The supporting portion 13*b* pushes the piezoelectric element P1 against the movable element 9 due to its reaction force. This increases the frictional force between the tips of the driver elements 8 and the movable element 9 so that the driving force produced by the vibration of the piezoelectric element P1 is effectively transmitted to the movable element 9 via the driver elements 8.

1.2: Piezoelectric Element P1

The piezoelectric element P1 of this embodiment is in the shape of a generally rectangular parallelepiped. The piezoelectric element P1 includes a plurality of generally rectangular piezoelectric layers 1, which are piezoelectric, and internal electrode layers interposed between the piezoelectric layers 1. The piezoelectric element P1 is configured in such a manner that the piezoelectric layers and the electrode layers are stacked in a direction from front to back of the drawing sheet of FIG. 1 (hereinafter, sometimes referred to as thickness direction).

Figure 2:
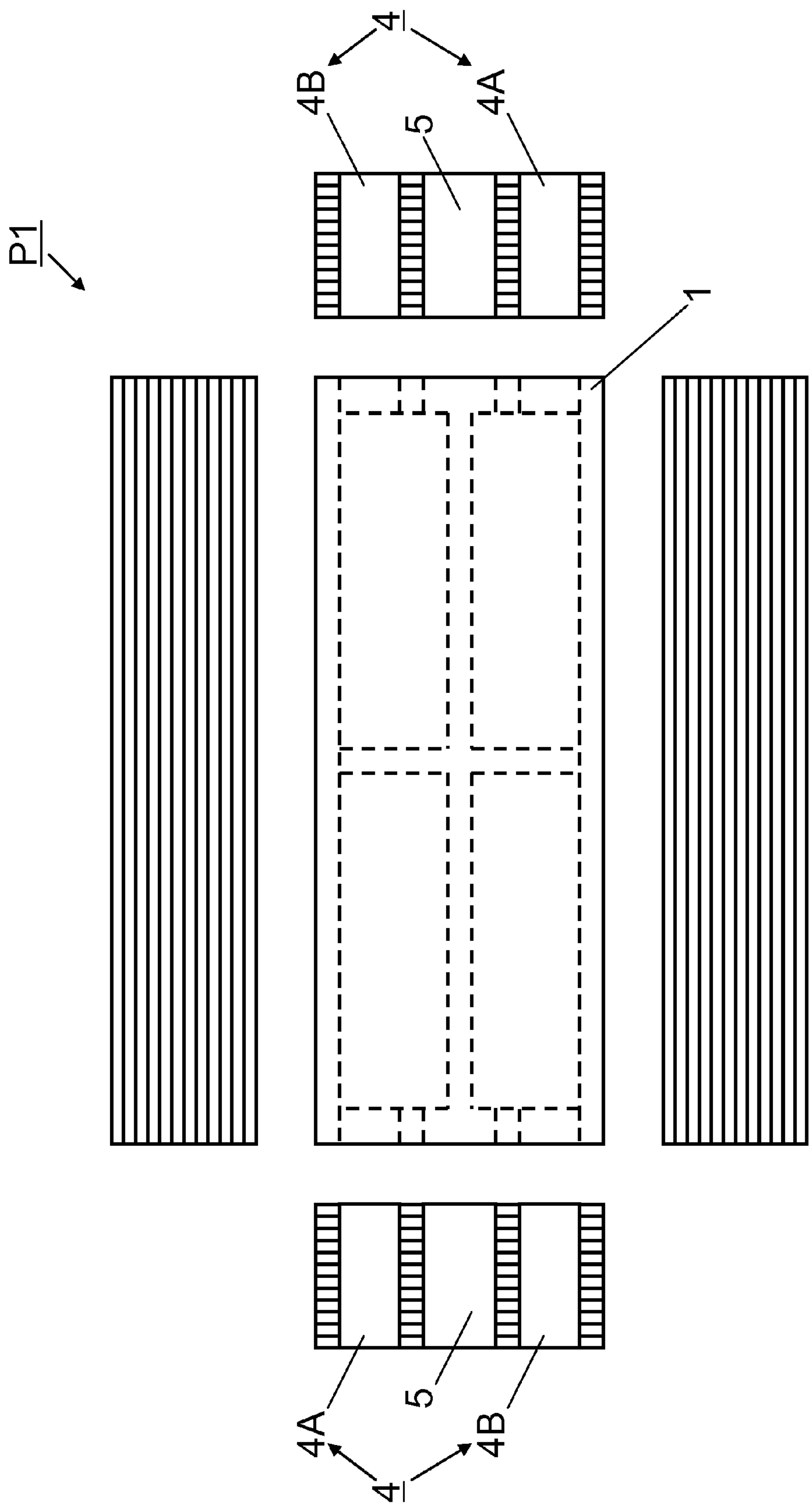
FIG. 2 is an orthographic developed view of a piezoelectric element P1 according to embodiment 1.

FIG. 2 is an orthographic developed view of the piezoelectric element P1 of this embodiment. In FIG. 2, a portion at the center represents the principal surface, portions on the right and left sides of the principal surface are the short-side surfaces, and portions on the upper and lower sides of the principal surface are the long-side surfaces. The internal electrode layers are located behind the principal surface, and thus cannot be seen. The positions of the internal electrode layers projected over the principal surface are represented by broken lines. FIG. 3 shows the respective layers of the piezoelectric element P1 of this embodiment which are seen in the stacking direction.

As shown in FIG. 2, the piezoelectric element P1 is in the shape of a generally rectangular parallelepiped, which is formed by alternately stacking the generally rectangular piezoelectric layers 1 and the internal electrode layers. The piezoelectric layer 1 is an insulation layer formed of, for example, a ceramic material, such as lead zirconate titanate. The internal electrode layers are formed of power supply electrodes 2 and counter electrodes 3 which are alternately provided in the stacking direction (thickness direction of the piezoelectric element P1) with the piezoelectric layers 1 interposed therebetween. The internal electrode layers are electrode layers which are formed of a metal containing, for example, silver and palladium as main constituents and which are provided on the principal surface of the piezoelectric layer 1.

As shown in FIG. 2, power supply external electrodes 4 and counter external electrodes 5 are provided on the short-side surfaces of the piezoelectric element P1. Specifically, the power supply external electrodes 4 include two first power supply external electrodes 4A and two second power supply external electrodes 4B which are mutually separate. The first power supply external electrodes 4A are provided on respective one of the two short-side surfaces of the piezoelectric element P1 at one lateral end of the piezoelectric element P1. The second power supply external electrodes 4B are provided on respective one of the two short-side surfaces of the piezoelectric element P1 at the other lateral end of the piezoelectric element P1 (i.e., the lateral end opposite to the first power supply external electrode 4A). The piezoelectric element P1 includes the two counter external electrodes 5. The counter external electrodes 5 are provided respectively on the two short-side surfaces of the piezoelectric element P1 at the lateral center of the piezoelectric element P1 (i.e., between the first power supply external electrode 4A and the second power supply external electrodes 4B). These electrodes 4A, 4B and 5 are mutually insulated. In other words, the electrodes 4A, 4B and 5 are not electrically coupled to one another.

Figures 3A, 3B, 3C:
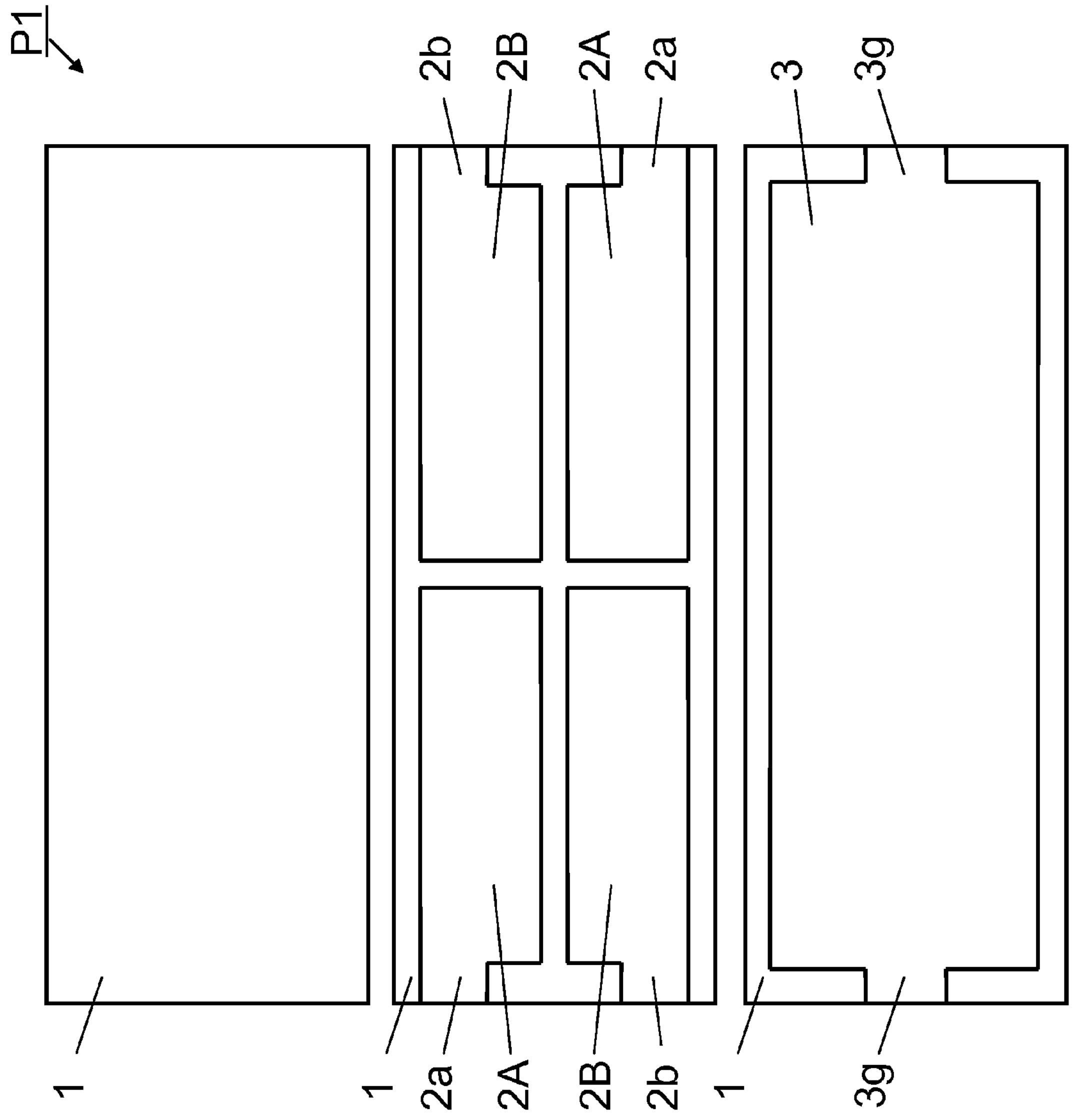
FIGS. 3A, 3B and 3C show the layers of the piezoelectric element of embodiment 1 which are seen in the layer stacking direction.

The power supply electrodes 2 are provided on a principal surface of at least one of the plurality of piezoelectric layers 1 as shown in FIG. 3(B).

Specifically, the power supply electrodes 2 include, on the same principal surface of the piezoelectric layer 1, two first power supply electrodes 2A and two second power supply electrodes 2B which are not electrically coupled to the first power supply electrodes 2A. The first power supply electrodes 2A and the second power supply electrodes 2B are rectangular electrodes.

Figure 4:
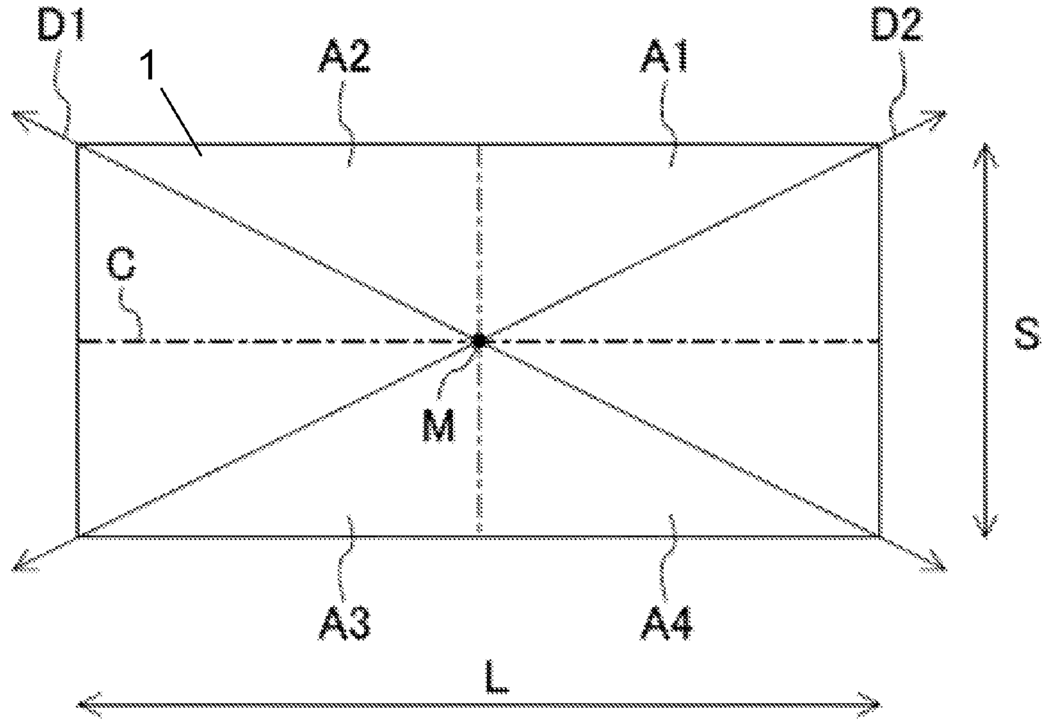
FIG. 4 illustrates the four regions over a principal surface of a piezoelectric layer.

Among four divisional regions A1-A4 (see FIG. 4) of the principal surface of the piezoelectric layer 1 which are defined by halving the principal surface with respect to both longitudinal direction L and lateral direction S, the first power supply electrodes 2A are provided in two of the four divisional regions which are aligned in the first diagonal direction D1 of the principal surface of the piezoelectric layer 1, i.e., in the divisional regions A2 and A4. The second power supply electrodes 2B are provided in the other two of the four divisional regions A1-A4 which are aligned in the second diagonal direction D2 of the principal surface of the piezoelectric layer 1, i.e., in the divisional regions A1 and A3.

Each of the first power supply electrodes 2A includes a first power supply lead electrode 2*a* extending to the first power supply external electrode 4A which is provided on a closer one of the two short-side surfaces of the piezoelectric element P1. In this way, the first power supply electrode 2A is electrically coupled to the first power supply external electrode 4A via the first power supply lead electrode 2*a*. The first power supply electrodes 2A which are provided in the same region (A2 or A4) on the principal surfaces of different piezoelectric layers 1 are electrically coupled to each other via the first power supply lead electrodes 2*a* and the first power supply external electrode 4A.

Each of the second power supply electrodes 2B includes a second power supply lead electrode 2*b* extending to the second power supply external electrode 4B which is provided on a closer one of the two short-side surfaces of the piezoelectric element P1. In this way, the second power supply electrode 2B is electrically coupled to the second power supply external electrode 4B via the second power supply lead electrode 2*b*. The second power supply electrodes 2B which are provided in the same region (A1 or A3) on the principal surfaces of different piezoelectric layers 1 are electrically coupled to each other via the second power supply lead electrodes 2*b* and the second power supply external electrode 4B.

The counter electrode 3 is provided over substantially the entire surface of the piezoelectric layer 1 as shown in FIG. 3(D). Specifically, the counter electrode 3 is not provided in a circumferential region of the principal surface of the piezoelectric layer 1 but is provided over substantially the entirety of a region inside the circumferential region. The counter electrode 3 includes counter lead electrodes 3*g* which extend from its lateral center to the counter external electrodes 5 which are provided on both short-side surfaces of the piezoelectric element P1. In this way, the counter electrode 3 is electrically coupled to the counter external electrodes 5 via the counter lead electrodes 3*g*. The counter electrodes 3 provided on different piezoelectric layers 1 are electrically coupled to each other via the counter lead electrodes 3*g* and the counter external electrodes 5.

The piezoelectric element P1 is formed by stacking the piezoelectric layers 1 provided with the power supply electrodes 2 or the counter electrode 3 on the principal surfaces as described above. Specifically, the plurality of piezoelectric layers 1 are sequentially stacked in the order of the piezoelectric layer 1 provided with the power supply electrodes 2, the piezoelectric layer 1 provided with the counter electrode 3, the piezoelectric layer 1 provided with the power supply electrodes 2, . . . . The piezoelectric layers 1 are stacked such that the principal surfaces provided with the power supply electrodes 2 or the counter electrode 3 are oriented in the same direction, i.e., such that the principal surface of one of the piezoelectric layers 1 on which the power supply electrodes 2 or the counter electrode 3 is provided face the principal surface of another one of the piezoelectric layers 1 on which none of the power supply electrodes 2 and the counter electrode 3 is provided. Note that, the first and/or last of the stacked layers are the piezoelectric layers 1 which are not provided with the power supply electrodes 2 or the counter electrode 3 such that the power supply electrodes 2 or the counter electrode 3 would not be exposed.

As a result of stacking the piezoelectric layers 1, the power supply electrodes 2 and the counter electrode 3, each of the piezoelectric layers 1 is sandwiched by the power supply electrodes 2 (specifically, the first power supply electrode 2A and the second power supply electrode 2B) and the counter electrode 3. Here, each of the piezoelectric layers 1 is polarized from the power supply electrode 2 side to the counter electrode 3 side.

In the thus-stacked structure, the power supply electrodes 2 and the counter electrode 3 are overlapping with each other with the piezoelectric layer 1 interposed therebetween when seen in the stacking direction. However, the piezoelectric layers 1 include a region in which the power supply electrodes 2 and the counter electrode 3 are not overlapping when seen in the stacking direction (see FIG. 2). For example, the first power supply lead electrode 2*a*, the second power supply lead electrode 2*b*, and the counter lead electrodes 3*g* are not overlapping with the counter electrode 3 or the power supply electrodes 2 when seen in the stacking direction. In part of the piezoelectric layers 1 corresponding to the non-overlapping region, no electric field occurs. In other words, this part of the piezoelectric layers 1 is piezoelectrically inactive. Specifically, in part of the piezoelectric layers 1 near the short-side surfaces, the power supply electrodes 2 and the counter electrode 3 are not overlapping when seen in the stacking direction. This part of the piezoelectric layers 1 is piezoelectrically inactive.

The resonance frequency of the stretching vibration and the resonance frequency of the bending vibration of the piezoelectric element P1, which will be described later, depend on the material, the shape, etc., of the piezoelectric element P1. The material, the shape, etc., of the piezoelectric element P1 are determined such that the resonance frequency of the stretching vibration and the resonance frequency of the bending vibration are approximately equal to each other.

1.3: Electrical Connection Member

In this embodiment, flexible cables F1 are used as the electrical connection member. The flexible cables F1 include a first flexible cable F11 and a second flexible cable F12. As shown in FIG. 1, the first flexible cable F11 and the second flexible cable F12 are electrically connected to the respective short-side surfaces of the piezoelectric element P1. The first flexible cable F11 and the second flexible cable F12 are electrically coupled to the piezoelectric element P1. The first flexible cable F11 and the second flexible cable F12 have substantially the same shape.

Figure 5:
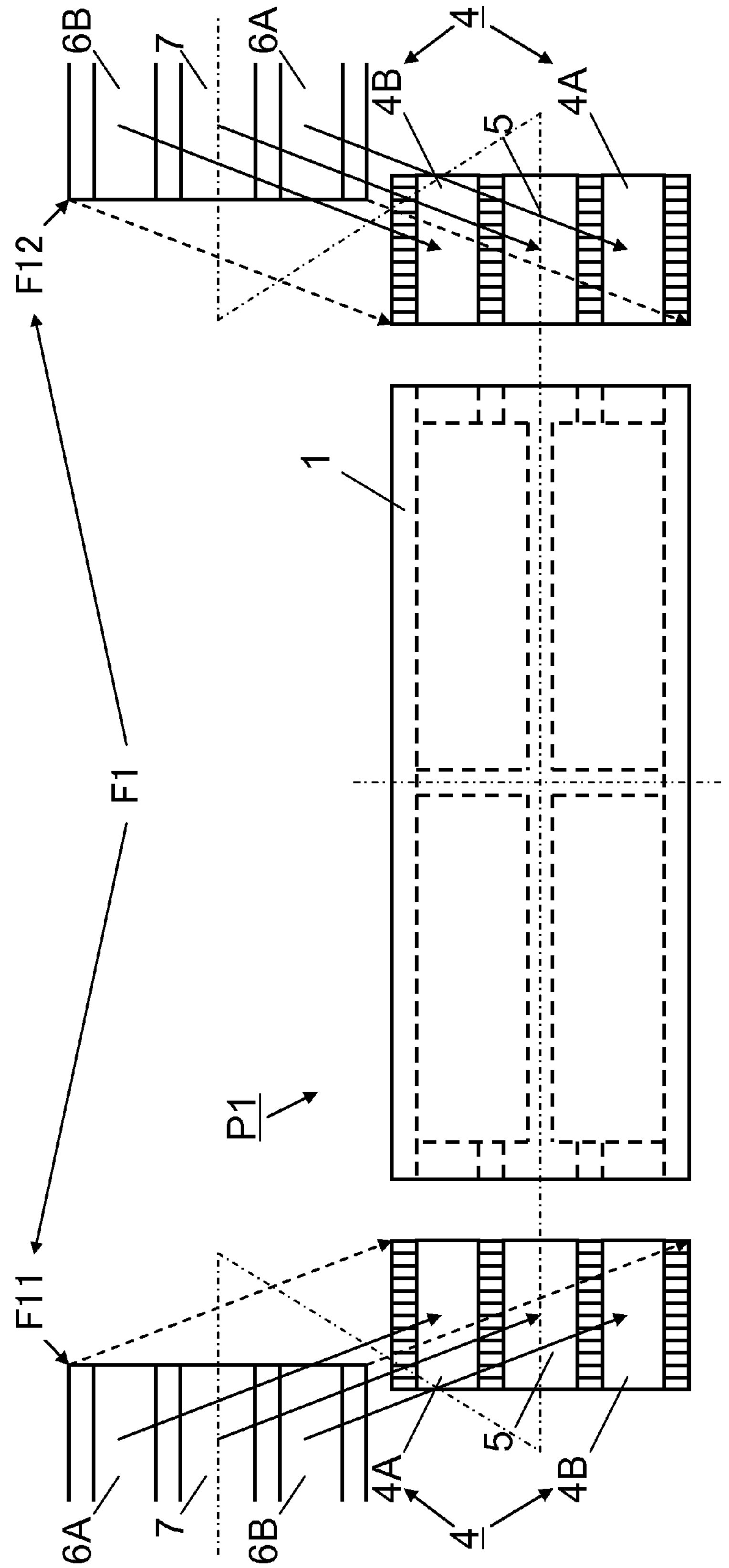
FIG. 5 shows the positional relationship for connection of flexible cables F1 and short-side surfaces of the piezoelectric element P1.

FIG. 5 shows the positional relationship in connection between the first and second flexible cables F11 and F12 and the lateral surfaces of the piezoelectric element P1. As shown in FIG. 5, the first and second flexible cables F11 and F12 include a plurality of electric wires formed by printing copper over an insulative resin substrate. The electric wires are mutually insulated.

The first flexible cable F11 is connected to one of the short-side surfaces of the piezoelectric element P1. The second flexible cable F12 is connected to the other one of the short-side surfaces of the piezoelectric element P1. The first flexible cable F11 and the second flexible cable F12 each have electric lines 6 which are connected to the power supply external electrodes 4 and an electric line 7 which is connected to the counter external electrodes 5. Specifically, the first flexible cable F11 and the second flexible cable F12 each have an electric line 6A which is coupled to the first power supply external electrode 4A, an electric line 6B which is coupled to the second power supply external electrode 4B, and an electric line 7 which is coupled to the counter external electrodes 5. In the first flexible cable F11, the electric line 6A, the electric line 7 and the electric line 6B are sequentially arranged from one lateral end to the other lateral end of the piezoelectric element P1. In the second flexible cable F12, the electric line 6B, the electric line 7 and the electric line 6A are sequentially arranged from the one lateral end to the other lateral end of the piezoelectric element P1. The electric lines 6 constitute the power supply conductive member. The electric line 7 constitutes the counter conductive member. More specifically, the electric line 6A constitutes the first power supply conductive member, and the electric line 6B constitutes the second power supply conductive member.

The first flexible cable F11 has a shape symmetrical about a plane which passes through the midpoints of the short sides of the principal plane of the piezoelectric layer 1 and which is perpendicular to the short-side surfaces. The second flexible cable F12 also has a shape symmetrical about the plane which passes through the midpoints of the short sides of the principal plane of the piezoelectric layer 1 and which is perpendicular to the short-side surfaces as does the first flexible cable F11. The first flexible cable F11 and the second flexible cable F12 have a shape symmetrical about a plane which passes through the midpoints of the long sides of the principal plane of the piezoelectric layer 1 and which is perpendicular to the principal surface. A connecting portion of the first flexible cable F11 which is connected to the piezoelectric element P1 has a shape symmetrical about the plane which passes through the midpoints of the short sides of the principal plane of the piezoelectric layer 1 and which is perpendicular to the short-side surfaces. Also, a connecting portion of the second flexible cable F12 which is connected to the piezoelectric element P1 has a shape symmetrical about the plane which passes through the midpoints of the short sides of the principal plane of the piezoelectric layer 1 and which is parallel to the long-side surfaces. The connecting portion of the first flexible cable F11 which is connected to the piezoelectric element P1, and the connecting portion of the second flexible cable F12 which is connected to the piezoelectric element P1 have a shape symmetrical about the plane which passes through the midpoints of the long sides of the principal plane of the piezoelectric layer 1 and which is parallel to the short-side surface.

In the connecting portions of the first and second flexible cables F11 and F12, and a connecting portion of the piezoelectric element P1, these elements are electrically connected and adhered using an anisotropic conductive adhesion sheet. The anisotropic conductive adhesion sheet is prepared by molding a resin containing electrically conductive particles dispersed therein into the form of a sheet, respectively. The anisotropic conductive adhesion sheet has an electric conductivity in the adhesion direction, i.e., in the sheet thickness direction, but lacks electric conductivity in the in-plane directions. Therefore, the plurality of electrodes provided over the short-side surfaces of the piezoelectric element P1 can be electrically connected to the respective electric lines of the first and second flexible cables F11 and F12 by a single anisotropic conductive adhesion sheet with the electrodes being mutually insulated. In the first step of the connection method, an anisotropic conductive sheet is sandwiched between the first and second flexible cables F11 and F12 made of polyimide and the piezoelectric element P1. Then, the first and second flexible cables F11 and F12 are pressed against the piezoelectric element P1 using a heated flat iron. As a result, the first and second flexible cables F11 and F12 and the piezoelectric element P1 are electrically coupled by the electrically conductive particles and adhered by the effect of the resin of the anisotropic conductive adhesion sheet.

The connection portions of the first and second flexible cables F11 and F12 and the piezoelectric element P1 are respectively interposed between the supporting portion 13*a* and the piezoelectric element P1 and between the supporting portion 13*c* and the piezoelectric element P1. Specifically, the first flexible cable F11 is pressed by the supporting portion 13*a* against the piezoelectric element P1. The second flexible cable F12 is pressed by the supporting portion 13*c* against the piezoelectric element P1.

The electric lines 6 connected to the power supply external electrodes 4 are an example of the power supply conductive member. The electric line 6A connected to the first power supply external electrode 4A is an example of the first power supply conductive member. The electric line 6B connected to the second power supply external electrode 4B is an example of the second power supply conductive member. The electric lines 7 connected to the counter external electrodes 5 are an example of the counter conductive member. The first flexible cable F11 is an example of the first electrical connection member. The second flexible cable F12 is an example of the second electrical connection member.

The first and second flexible cables F11 and F12 are coupled to a power supply (not shown). A driving voltage from the power supply is applied to the piezoelectric element P1 via the first and second flexible cables F11 and F12 such that vibration is generated in the piezoelectric element P1.

1.4: Operation of Ultrasonic Actuator

Figure 6:
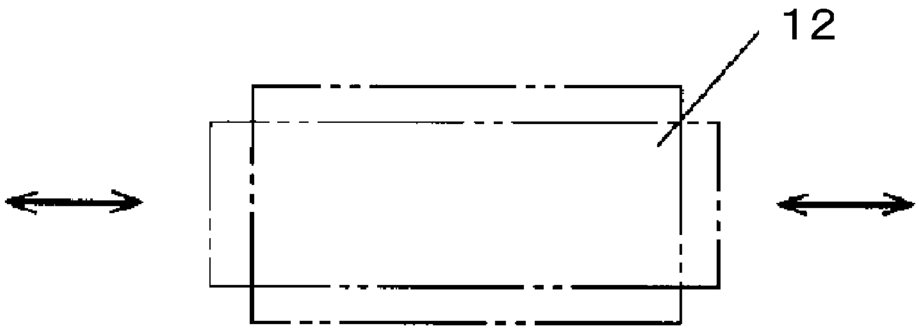
FIG. 6 is a concept diagram illustrating the displacement of the first mode stretching vibration of the ultrasonic actuator.
Figure 7:
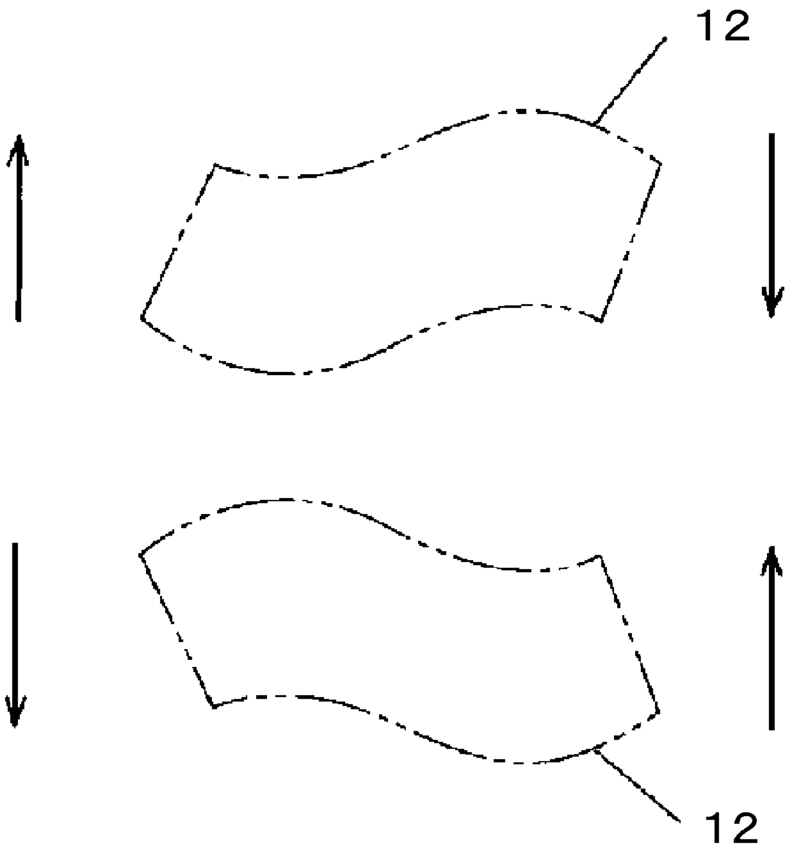
FIG. 7 is a concept diagram illustrating the displacement of the second mode bending vibration of the ultrasonic actuator.
Figure 8A:
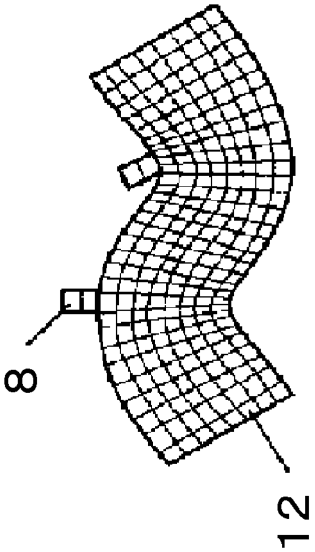
FIGS. 8A, 8B, 8C and 8D show a concept diagram illustrating the operation of the ultrasonic actuator.
Figure 8B:
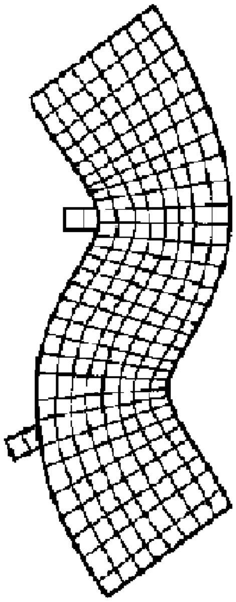
Figure 8C:
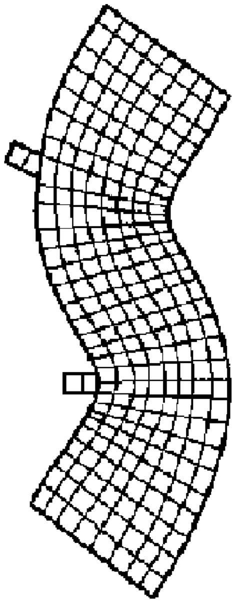
Figure 8D:
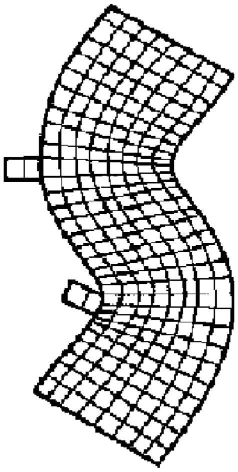

Hereinafter, an operation of the ultrasonic actuator is described. FIG. 6 is a concept diagram illustrating the displacement of the first-order stretching vibration according to this embodiment. FIG. 7 is a concept diagram illustrating the displacement of the second-order bending vibration of the ultrasonic actuator. FIG. 8 is a concept diagram illustrating the operation of the piezoelectric element P1. Note that, in FIGS. 6-8, the principal surface of the piezoelectric element P1 is parallel to the surfaces of the sheets of the drawings.

The electric lines 7 of the flexible cables F11 and F12 are coupled to the ground. The power supply applies a sinusoidal driving voltage of a predetermined frequency, as the first driving voltage, to the first power supply electrode 2A of the principal surface of the piezoelectric layer 1 via the electric line 6A and the first power supply external electrode 4A. Also, the power supply also applies a sinusoidal second driving voltage to the second power supply electrode 2B via the electric line 6B and the second power supply external electrode 4B. The amplitude and frequency of the second driving voltage are substantially equal to those of the first driving voltage. The frequencies of the first and second driving voltages are set near the resonance frequency of the stretching vibration and the resonance frequency of the bending vibration of the piezoelectric element P1 which are substantially equal to each other.

When the phase difference between the first driving voltage applied to the first power supply electrode 2A and the second driving voltage applied to the second power supply electrode 2B is 0°, the first-order stretching vibration is induced in the piezoelectric element P1 as shown in FIG. 6. When the phase difference is 180°, the second-order bending vibration is induced in the piezoelectric element P1 as shown in FIG. 7.

When the phase difference between the first driving voltage applied to the first power supply electrode 2A and the second driving voltage applied to the second power supply electrode 2B is generally 90° or −90°, the first-order stretching vibration and the second-order bending vibration are harmonically induced in the piezoelectric element P1 as shown in FIG. 8. As a result, the piezoelectric element P1 vibrates with its shape being sequentially deformed in the order of FIG. 8(A), FIG. 8(B), FIG. 8(C), and FIG. 8(D). The driver elements 8 provided on the piezoelectric element P1 make a revolutionary movement, specifically a generally-elliptic movement, when seen in the direction perpendicular to the surface of the sheet of FIG. 8. In other words, the composite vibration of the stretching vibration and bending vibration of the piezoelectric element P1 causes the driver elements 8 to make an elliptic movement. Due to this elliptic movement, the movable element 9 on which the driver elements 8 abut moves relative to the piezoelectric element P1.

The piezoelectric element P1 is arranged such that the longitudinal direction of its principal surface is equal to the movable direction of the movable element 9, and that the lateral direction of its principal surface is equal to the direction in which the piezoelectric element P1 is biased by the supporting portion 13*b* toward the movable element 9. The stretching direction of the stretching vibration of the piezoelectric element P1 is equal to the movable direction of the movable element 9, and the vibration direction of the bending vibration is equal to the direction in which the driver elements 8 are pressed against the movable element 9. Note that the stacking direction of the piezoelectric element P1 is perpendicular to both the stretching direction of the stretching vibration and the vibration direction of the bending vibration.

The short-side surfaces of the piezoelectric element P1 are far away from a stress-concentrated part of the stretching vibration and therefore create only a small stress. Since the short-side surfaces are free ends of the piezoelectric element P1, only a small stress is created even in the case of the bending vibration. In this embodiment, the first and second flexible cables F11 and F12 are connected to the short-side surfaces. Therefore, the stress created in the connection faces (connection portions) by vibration of the piezoelectric element is reduced. Thus, occurrence of peeling at the connection faces can be prevented. In this embodiment, the connection faces of the piezoelectric element P1 and the first and second flexible cables F11 and F12 include connection faces of the piezoelectric element P1 and the anisotropic conductive adhesion sheets and connection faces of the anisotropic conductive adhesion sheets and the first and second flexible cables F11 and F12.

1.5: Advantages of Embodiment

In this embodiment, the short-side surfaces of the piezoelectric element P1 are far away from a stress-concentrated part of the first mode stretching vibration and therefore create only a small stress. Since the lateral surfaces are free ends of the piezoelectric element, only a small stress is created even in the case of the second mode bending vibration. In view of such circumstances, the flexible cables F1, which are the electrical connection members, are connected to the short-side surfaces of the piezoelectric element P1, so that the stress created in the connection faces of the flexible cables F1 and the piezoelectric element P1 by vibration of the piezoelectric element P1 is reduced. Thus, occurrence of peeling at the connection faces of the piezoelectric element P1 and the flexible cables F1 can be prevented. In other words, the electrical connection members are connected to the short-side surfaces of the piezoelectric element P1 which maintain themselves substantially flat even in the first mode stretching vibration and in the second mode bending vibration, whereby stress is unlikely to occur in the planes of the electrical connection members, and stable connection can be realized.

When seen in a direction perpendicular to the principal surface of the piezoelectric element P1, an area of the power supply electrodes 2 and an area of the counter electrode 3 are not overlapping in regions near the short sides of the principal surface of the piezoelectric layer 1. Therefore, part of the piezoelectric layer 1 near the short sides of its principal surface is piezoelectrically inactive, and occurrence of strain due to electrostrictive effect is reduced. Since the stress created in the connection faces of the electrical connection members and the piezoelectric element P1 by vibration of the piezoelectric element is reduced by connecting the electrical connection members to the short-side surfaces of the piezoelectric element P1, occurrence of peeling at the connection faces can be prevented. When the piezoelectric element P1 and the electrical connection members are connected by heating, such heating can result in reduced polarization of the piezoelectric layer 1 near the short-side surfaces of the piezoelectric element P1. Collapse of the balance of polarization near the two short-side surfaces leads to collapse of the vibration balance. However, since the part of the piezoelectric element P1 near the short-side surfaces piezoelectrically inactive as described above, collapse of the balance of vibration of the piezoelectric element P1 can be prevented even if the state of polarization of the piezoelectric layer 1 is altered by the heat applied for connection of the electrical connection members. Examples of the thermal connection of the piezoelectric element P1 and the electrical connection members by heating include connection with an anisotropic conductive adhesive sheet as in the above-described embodiment as well as connection with a conductive adhesive, a low-melting metal, etc.

The electrical connection members include the first electrical connection member and the second electrical connection member. The first electrical connection member is electrically connected to the piezoelectric element P1 at one of the two short-side surfaces which are perpendicular to the principal surface of the piezoelectric layer 1 and which are parallel to the short sides of the principal surface. The second electrical connection member is electrically connected to the piezoelectric element P1 at the other short-side surface. The shape of the first electrical connection member is symmetrical about a plane which passes through the midpoints of the short sides of the principal surface of the piezoelectric layer 1 and which is perpendicular to the one of the two lateral surfaces. The shape of the second electrical connection member is symmetrical about a plane which passes through the midpoints of the short sides of the principal surface of the piezoelectric layer 1 and which is perpendicular to the other one of the two lateral surfaces. In this configuration, the influence of the connection of the electrical connection members on vibration is symmetrical about a plane which passes through the midpoints of the short sides of the principal surface of the piezoelectric layer and which is perpendicular to the short-side surfaces. The influence of the connection of the electrical connection members on the symmetry of vibration can be reduced. As a result, the vibration balance of the piezoelectric element can be improved.

The first electrical connection member and the second electrical connection member are shaped symmetrical about a plane which passes through the midpoints of the long sides of the principal surface of the piezoelectric layer 1 and which is perpendicular to the principal surface. In this configuration, the influence of the connection of the electrical connection members on vibration is symmetrical about a plane which passes through the midpoints of the long sides of the principal surface of the piezoelectric layer 1 and which is perpendicular to the principal surface. The influence of the connection of the electrical connection members on the symmetry of vibration can be reduced.

Since the driver elements 8 and the piezoelectric element P1 are fixedly in point contact or line contact with each other, interference with the bending vibration of the piezoelectric element P1 can be reduced, and the efficiency of the bending vibration can be improved.

Embodiment 2

An ultrasonic actuator according to embodiment 2 of the present invention is now described. Note that elements equivalent to those described in the above embodiment are denoted by the same reference characters, and the description thereof is herein omitted. The ultrasonic actuator of embodiment 2 is different from embodiment 1 in the configurations of the piezoelectric element and the flexible cables.

2.1: Piezoelectric Element P2

The piezoelectric element P2 of this embodiment is in the shape of a generally rectangular parallelepiped. The piezoelectric element P2 includes a plurality of generally rectangular piezoelectric layers 1, and internal electrode layers interposed between the piezoelectric layers 1. The piezoelectric element P2 includes the piezoelectric layers and the electrode layers which are stacked in a direction from front to back of the drawing sheet of FIG. 1.

Figure 9:
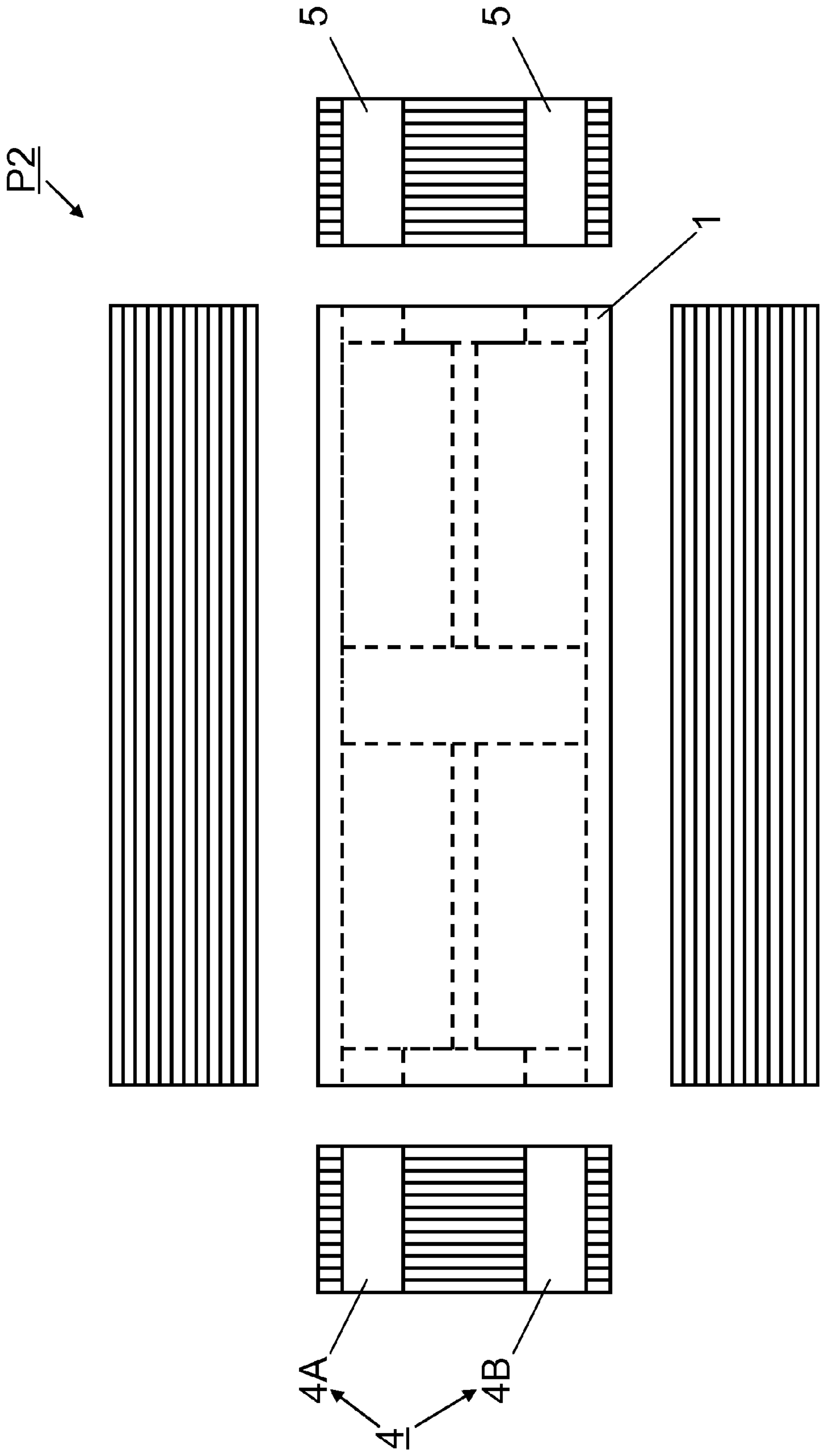
FIG. 9 is an orthographic developed view of the piezoelectric element P2 according to embodiment 2.

FIG. 9 is an orthographic developed view of the piezoelectric element P2. FIG. 10 shows the respective layers of the piezoelectric element P2 which are seen in the stacking direction.

As shown in FIG. 9, the piezoelectric element P2 is in the shape of a generally rectangular parallelepiped, which is formed by alternately stacking the generally rectangular piezoelectric layers 1 and the internal electrode layers. The piezoelectric layer 1 is an insulation layer formed of, for example, a ceramic material, such as lead zirconate titanate. The internal electrode layers are formed of power supply electrodes 2 and counter electrodes 3 which are alternately provided in the stacking direction (thickness direction of the piezoelectric element P2) with the piezoelectric layers 1 interposed therebetween. In FIG. 9, a portion at the center represents the principal surface, portions on the right and left sides of the principal surface are the short-side surfaces, and portions on the upper and lower sides of the principal surface are the long-side surfaces. The internal electrode layers are behind the principal surface and thus cannot be seen. The positions of the internal electrode layers projected over the principal surface are represented by broken lines.

As shown in FIG. 9, power supply external electrodes 4 and counter external electrodes 5 are provided on the short-side surfaces of the piezoelectric element P2. Specifically, the power supply external electrodes 4 include a first power supply external electrode 4A and a second power supply external electrode 4B which are mutually separate. The first power supply external electrode 4A and the second power supply external electrode 4B are provided on one of the two short-side surfaces of the piezoelectric element P2. The piezoelectric element P2 includes the two counter external electrodes 5 which are provided on the other one of the two short-side surfaces. These electrodes 4A, 4B and 5 are mutually insulated. In other words, the electrodes 4A, 4B and 5 are not electrically coupled to one another.

Figure 10A:
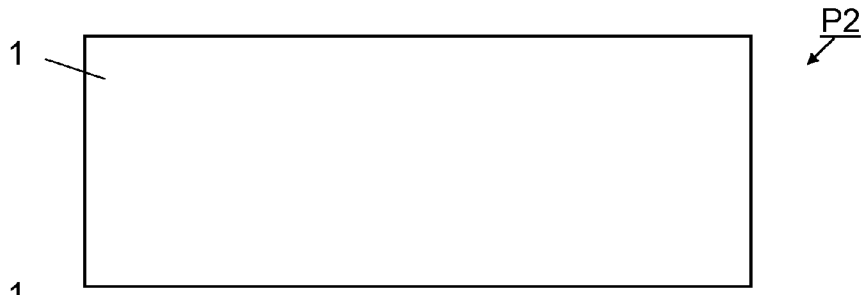
FIGS. 10A, 10B, 10C and 10D show the layers of the piezoelectric element P2 of embodiment 2 which are seen in the layer stacking direction.
Figure 10B:
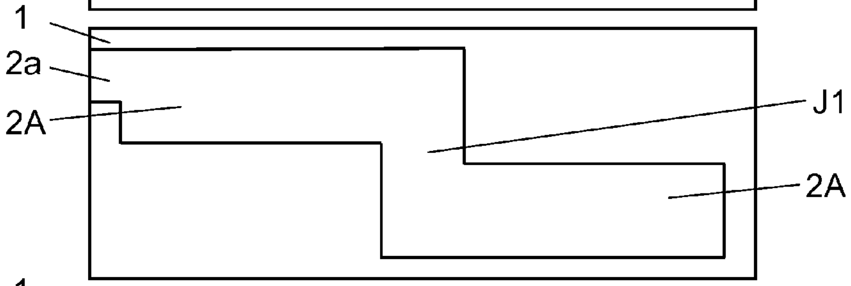
Figure 10C:
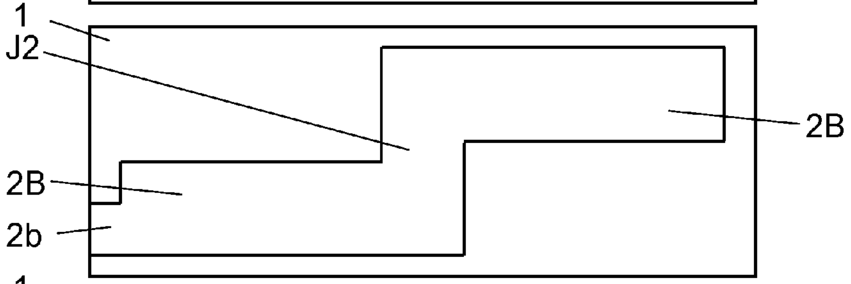

The power supply electrodes 2 are provided on the principal surface of at least one of the plurality of piezoelectric layers 1 as shown in FIG. 10(B) and FIG. 10(C). Specifically, the power supply electrodes 2 are provided on the principal surface of at least one of the plurality of piezoelectric layers 1 in the first pattern as shown in FIG. 10(B). On the principal surface of another one of the plurality of piezoelectric layers 1 different from the piezoelectric layer 1 on which the power supply electrodes 2 are provided in the first pattern, the power supply electrodes 2 are provided in the second pattern as shown in FIG. 10(C) which is different from the first pattern.

The power supply electrodes 2 include first power supply electrodes 2A which are provided on the principal surface of one of the piezoelectric layers 1 and second power supply electrodes 2B which are provided on the principal surface of another one of the plurality of piezoelectric layers 1 different from the piezoelectric layer 1 provided with the first power supply electrode 2A. The first power supply electrodes 2A and the second power supply electrodes 2B are not electrically coupled to each other.

Specifically, among four divisional regions A1-A4 (see FIG. 4) of the principal surface of the piezoelectric layer 1 which are defined by halving the principal surface with respect to both longitudinal direction L and lateral direction S, the first power supply electrodes 2A are provided in two of the four divisional regions which are aligned in the first diagonal direction D1 of the principal surface of the piezoelectric layer 1, i.e., in the divisional regions A2 and A4. Further, the power supply electrodes 2 include a first connection electrode J1 extending in the lateral direction at the longitudinal center of the principal surface of the piezoelectric layer 1. The first power supply electrodes 2A provided in the two divisional regions A2 and A4 are electrically connected via the first connection electrode J1. The first power supply electrodes 2A and the first connection electrode J1 constitute the first pattern.

The second power supply electrodes 2B are provided in the other two of the four divisional regions A1-A4 (see FIG. 4) which are aligned in the second diagonal direction D2 of the principal surface of the piezoelectric layer 1, i.e., in the divisional regions A1 and A3. Further, the power supply electrodes 2 include a second connection electrode J2 extending in the lateral direction at the longitudinal center of the principal surface of the piezoelectric layer 1. The second power supply electrodes 2B provided in the two divisional regions A1 and A3 are electrically coupled via the second connection electrode J2. The second power supply electrodes 2B and the second connection electrode J2 constitute the second pattern.

Among the first power supply electrodes 2A provided in the two divisional regions A2 and A4, the first power supply electrode 2A provided in the divisional region A2 which is closer to the short-side surface that has the first power supply external electrode 4A thereon includes a first power supply lead electrode 2*a* extending to the first power supply external electrode 4A. In this way, the first power supply electrode 2A of the divisional region A2 is electrically coupled to the first power supply external electrode 4A via the first power supply lead electrode 2*a*. The first power supply electrodes 2A of different piezoelectric layers 1 are electrically coupled to each other via the first power supply external electrode 4A, the first power supply lead electrodes 2*a*, and the first connection electrodes J1.

In each of the first and second patterns, among the second power supply electrodes 2B provided in the two divisional regions A1 and A3, the second power supply electrode 2B provided in the divisional region A3 which is closer to the short-side surface that has the second power supply external electrode 4B thereon includes a second power supply lead electrode 2*b* extending to the second power supply external electrode 4B. In this way, the second power supply electrode 2B of the divisional region A3 is electrically coupled to the second power supply external electrode 4B via the second power supply lead electrode 2*b*. The second power supply electrodes 2B of different piezoelectric layers 1 are electrically coupled to each other via the second power supply external electrode 4B, the second power supply lead electrodes 2*b*, and the second connection electrodes J2.

Figure 10D:
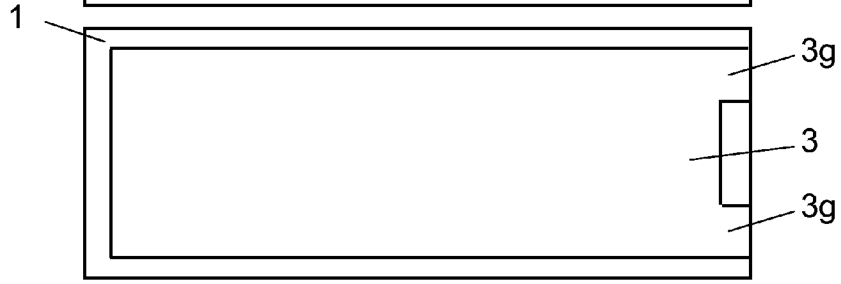

The counter electrode 3 is provided over substantially the entire surface of the piezoelectric layer 1 as shown in FIG. 10(D). Specifically, the counter electrode 3 is not provided in a circumferential region of the principal surface of the piezoelectric layer 1 but is provided over substantially the entirety of a region inside the circumferential region. The counter electrode 3 includes counter lead electrodes 3*g* which extend from both ends of a short-side near the short-side surface that has the counter external electrodes 5 thereon toward the counter external electrodes 5 so as to be connected to the counter external electrodes 5. In this way, the counter electrode 3 is electrically coupled to the counter external electrodes 5 via the counter lead electrodes 3*g*. The counter electrodes 3 provided on different piezoelectric layers 1 are electrically coupled to each other via the counter lead electrodes 3*g* and the counter external electrodes 5.

The piezoelectric element P2 is formed by stacking the piezoelectric layers 1 provided with the power supply electrodes 2 or the counter electrode 3 on the principal surfaces as described above. Specifically, the plurality of piezoelectric layers 1 are sequentially stacked in the order of the piezoelectric layer 1 provided with the first pattern power supply electrodes 2 (i.e., the first power supply electrodes 2A), the piezoelectric layer 1 provided with the counter electrode 3, the piezoelectric layer 1 provided with the second pattern power supply electrodes 2 (i.e., the second power supply electrodes 2B), the piezoelectric layer 1 provided with the counter electrode 3, the piezoelectric layer 1 provided with the first pattern power supply electrodes 2, the piezoelectric layer 1 provided with the counter electrode 3, . . . . The piezoelectric layers 1 are stacked such that the principal surfaces provided with the power supply electrodes 2 or the counter electrode 3 are oriented in the same direction, i.e., such that the principal surface of one of the piezoelectric layers 1 on which the power supply electrodes 2 or the counter electrode 3 is provided face the principal surface of another one of the piezoelectric layers 1 on which none of the power supply electrodes 2 and the counter electrode 3 is provided. Note that, the first and/or last of the stacked layers are the piezoelectric layers 1 which are not provided with the power supply electrodes 2 or the counter electrode 3 such that the power supply electrodes 2 or the counter electrode 3 would not be exposed.

As a result of stacking the piezoelectric layers 1, the power supply electrodes 2 and the counter electrode 3, each of the piezoelectric layers 1 is sandwiched by the power supply electrodes 2 (specifically, the first power supply electrode 2A or the second power supply electrode 2B) and the counter electrode 3. Thus, when seen in the stacking direction, the power supply electrodes 2 and the counter electrode 3 are overlapping with each other with the piezoelectric layer 1 interposed therebetween. Here, each of the piezoelectric layers 1 is polarized from the power supply electrode 2 side to the counter electrode 3 side.

However, the piezoelectric layers 1 include a region in which the power supply electrodes 2 and the counter electrode 3 are not overlapping when seen in the stacking direction (see FIG. 9). For example, the first power supply lead electrode 2*a*, the second power supply lead electrode 2*b*, and the counter lead electrodes 3*g* are not overlapping with the counter electrode 3 or the power supply electrodes 2 when seen in the stacking direction. In part of the piezoelectric layers 1 corresponding to the non-overlapping region, no electric field occurs. In other words, this part of the piezoelectric layers 1 is piezoelectrically inactive. Specifically, in part of the piezoelectric layers 1 near the short-side surfaces, the power supply electrodes 2 and the counter electrode 3 are not overlapping when seen in the stacking direction. This part of the piezoelectric layers 1 is piezoelectrically inactive.

The resonance frequency of the stretching vibration and the resonance frequency of the bending vibration of the piezoelectric element P2, which will be described later, depend on the material, the shape, etc., of the piezoelectric element P2. The material, the shape, etc., of the piezoelectric element P2 are determined such that the resonance frequency of the stretching vibration and the resonance frequency of the bending vibration are approximately equal to each other.

2.2: Electrical Connection Member

In this embodiment, flexible cables F2 are used as the electrical connection member. The flexible cables F2 include a first flexible cable F21 and a second flexible cable F22. As shown in FIG. 1, the first flexible cable F21 and the second flexible cable F22 are electrically connected to the respective short-side surfaces of the piezoelectric element P2. The first flexible cable F21 and the second flexible cable F22 are electrically coupled to the piezoelectric element P2. The first flexible cable F21 and the second flexible cable F22 have substantially the same shape.

Figure 11:
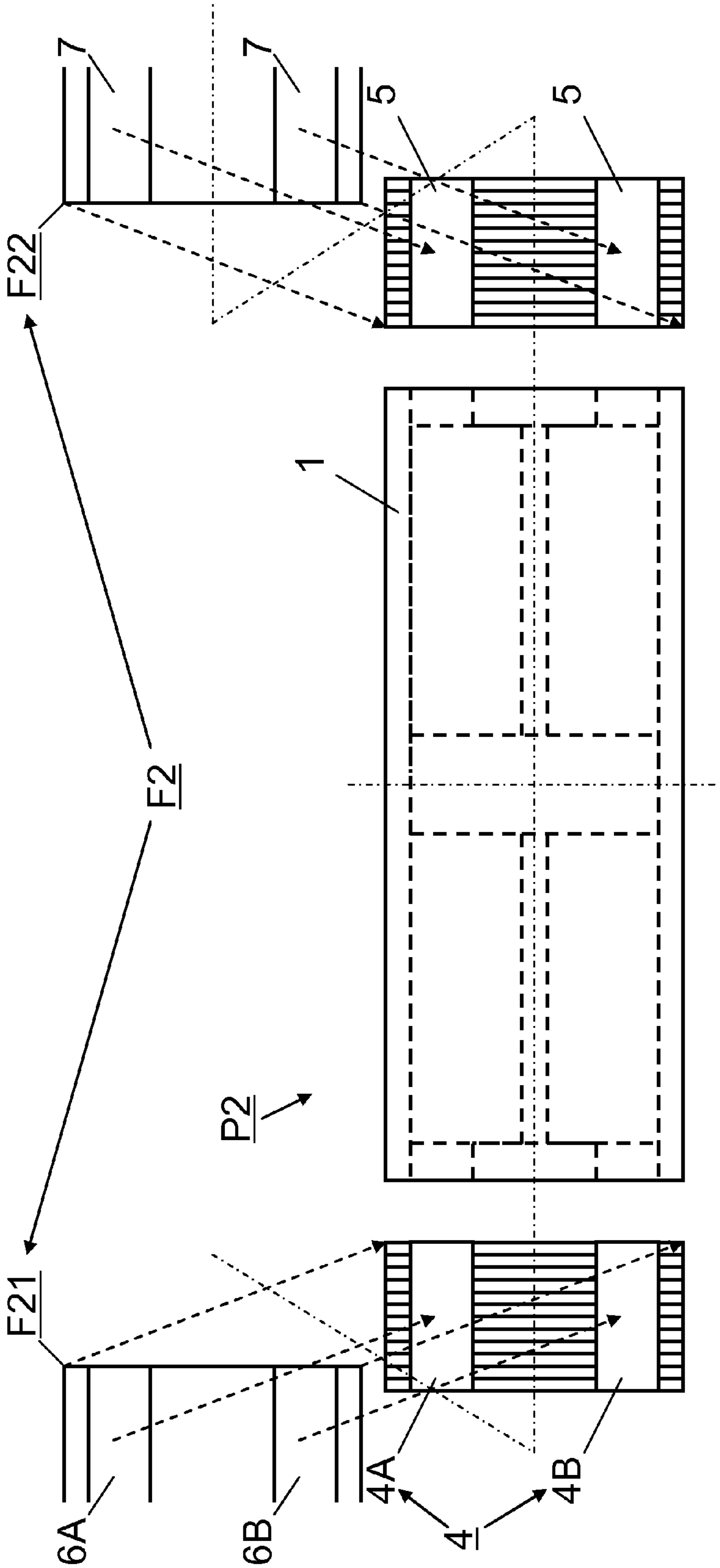
FIG. 11 shows the positional relationship for connection of flexible cables F2 and short-side surfaces of the piezoelectric element P2.

FIG. 11 shows the positional relationship in connection between the first and second flexible cables F21 and F22 and the lateral surfaces of the piezoelectric element P2. As shown in FIG. 11, the first and second flexible cables F21 and F22 include a plurality of electric wires formed by printing copper over an insulative resin substrate. The electric wires are mutually insulated.

The first flexible cable F21 is connected to one of the short-side surfaces of the piezoelectric element P2. The first flexible cable F21 has electric lines 6 which are connected to the power supply external electrodes 4. Specifically, the first flexible cable F21 has an electric line 6A connected to the first power supply external electrode 4A and an electric line 6B connected to the second power supply external electrode 4B.

The second flexible cable F22 is connected to the other one of the short-side surfaces of the piezoelectric element P2. The second flexible cable F22 has electric lines 7 which are connected to the counter external electrodes 5. Specifically, the second flexible cable F22 has electric lines 7 connected to the counter external electrodes 5.

The first flexible cable F21 has a shape symmetrical about a plane which passes through the midpoints of the short sides of the principal plane of the piezoelectric layer 1 and which is perpendicular to the short-side surfaces. The second flexible cable F22 also has a shape symmetrical about the plane which passes through the midpoints of the short sides of the principal plane of the piezoelectric layer 1 and which is perpendicular to the short-side surfaces. The first flexible cable F21 and the second flexible cable F22 have a shape symmetrical about a plane which passes through the midpoints of the long sides of the principal plane of the piezoelectric layer 1 and which is perpendicular to the principal surface. A connecting portion of the first flexible cable F21 which is connected to the piezoelectric element P2 has a shape symmetrical about the plane which passes through the midpoints of the short sides of the principal plane of the piezoelectric layer 1 and which is perpendicular to the short-side surfaces. A connecting portion of the second flexible cable F22 which is connected to the piezoelectric element P2 also has a shape symmetrical about the plane which passes through the midpoints of the short sides of the principal plane of the piezoelectric layer 1 and which is perpendicular to the short-side surfaces. The connecting portion of the first flexible cable F21 which is connected to the piezoelectric element P2 and the connecting portion of the second flexible cable F22 which is connected to the piezoelectric element P2 have a shape symmetrical about the plane which passes through the midpoints of the long sides of the principal plane of the piezoelectric layer 1 and which is perpendicular to the principal surface.

In the connecting portions of the first and second flexible cables F21 and F22 and a connecting portion of the piezoelectric element P2, these elements are electrically connected and adhered using an anisotropic conductive adhesion sheet. The anisotropic conductive adhesion sheet is prepared by molding a resin containing electrically conductive particles dispersed therein into the form of a sheet. The anisotropic conductive adhesion sheet has an electric conductivity in the adhesion direction, i.e., in the sheet thickness direction, but lacks electric conductivity in the in-plane directions of the adhesion surface. Therefore, the plurality of electrodes provided over the short-side surfaces of the piezoelectric element P2 can be electrically connected to the respective electric lines of the first and second flexible cables F21 and F22 by a single anisotropic conductive adhesion sheet with the electrodes being mutually insulated. In the first step of the connection method, an anisotropic conductive sheet is sandwiched between the first and second flexible cables F21 and F22 made of polyimide and the piezoelectric element P2. Then, the first and second flexible cables F21 and F22 are pressed against the piezoelectric element P2 using a heated planar cautery. As a result, the first and second flexible cables F21 and F22 and the piezoelectric element P2 are electrically coupled by the electrically conductive particles and adhered by means of the resin of the anisotropic conductive adhesion sheet.

The connection portions of the first and second flexible cables F21 and F22 and the piezoelectric element P2 are respectively interposed between the supporting portion 13*a* and the piezoelectric element P2 and between the supporting portion 13*c* and the piezoelectric element P2. Specifically, the first flexible cable F21 is pressed by the supporting portion 13*a* against the piezoelectric element P2. The second flexible cable F22 is pressed by the supporting portion 13*c* against the piezoelectric element P2.

The electric lines 6 connected to the power supply external electrodes 4 are an example of the power supply conductive member. The electric line 6A connected to the first power supply external electrode 4A is an example of the first power supply conductive member. The electric line 6B connected to the second power supply external electrode 4B is an example of the second power supply conductive member. The electric lines 7 connected to the counter external electrodes 5 are an example of the counter conductive member. The first flexible cable F21 is an example of the first electrical connection member. The second flexible cable F22 is an example of the second electrical connection member.

The first and second flexible cables F21 and F22 are coupled to a power supply (not shown). A driving voltage from the power supply is applied to the piezoelectric element P2 via the first and second flexible cables F21 and F22 such that vibration is generated in the piezoelectric element P2.

2.3: Operation of Ultrasonic Actuator

Hereinafter, an operation of the ultrasonic actuator is described. The operation of the ultrasonic actuator of this embodiment is basically the same as that of the ultrasonic actuator of embodiment 1. Specifically, a first driving voltage at a frequency near the substantially-matched resonance frequencies of the stretching vibration and the bending vibration of the piezoelectric element P2 is applied to the first power supply electrode 2A, and a second driving voltage which is approximately equal in amplitude and frequency to and different in phase by generally 90° or −90° from the first driving voltage is applied to the second power supply electrode 2B, whereby the first-order stretching vibration and the second-order bending vibration are harmonically induced in the piezoelectric element P2. As a result, the piezoelectric element P2 vibrates with its shape being sequentially deformed in the order of FIG. 8(A), FIG. 8(B), FIG. 8(C), and FIG. 8(D). The driver elements 8 provided on the piezoelectric element P2 make an orbit movement, specifically a generally-elliptic movement, when seen in the direction perpendicular to the surface of the sheet of FIG. 8. In other words, the composite vibration of the stretching vibration and bending vibration of the piezoelectric element P2 causes the driver elements 8 to make an elliptic movement. Due to this elliptic movement, the movable element 9 on which the driver elements 8 abut moves relative to the piezoelectric element P2.

In this embodiment, the first power supply external electrode 4A and the counter external electrodes 5 are provided at different short-side surfaces. The second power supply external electrode 4B and the counter external electrodes 5 are provided at different short-side surfaces. Therefore, a sufficient distance can be ensured between the first power supply external electrode 4A and the counter external electrodes 5 and between the second power supply external electrode 4B and the counter external electrodes 5. Accordingly, sufficient insulation can be ensured between the first power supply external electrode 4A and the counter external electrodes 5 and between the second power supply external electrode 4B and the counter external electrodes 5.

2.4: Advantages of Embodiment

According to this embodiment, the first power supply external electrode 4A and the counter external electrodes 5 are provided at different short-side surfaces. The second power supply external electrode 4B and the counter external electrodes 5 are provided at different short-side surfaces. This configuration ensures a sufficient distance between the first power supply external electrode 4A and the counter external electrodes 5 and between the second power supply external electrode 4B and the counter external electrodes 5. Accordingly, sufficient insulation can be ensured between the first power supply external electrode 4A and the counter external electrodes 5 and between the second power supply external electrode 4B and the counter external electrodes 5.

The principal surface of the piezoelectric layer 1 on which the first power supply electrode is provided has the first connection electrode J1 which provides electrical connection between the first power supply electrodes 2A. The principal surface of another piezoelectric layer 1, which is different from the principal surface that has the first connection electrode J1 thereon, has the second connection electrode J2 which provides electrical connection between the second power supply electrodes 2B. This configuration enables reduction of the number of the first power supply external electrodes 4A which are electrically coupled to the first power supply electrodes 2A and the number of the second power supply external electrodes 4B which are electrically coupled to the second power supply electrode 2B. For example, a structure which has the first connection electrode J1 and the second connection electrode J2 requires only one piece of the first power supply external electrode 4A and one piece of the second power supply external electrode 4B whereas embodiment 1 which does not have the first connection electrode J1 or the second connection electrode J2 requires two pieces of the first power supply external electrodes 4A and two pieces of the second power supply external electrodes 4B. As a result, the number of connection points between the piezoelectric element P2 and the electrical connection members can be reduced, and accordingly, the probability of occurrence of peeling at the connection faces between the piezoelectric element P2 and the electrical connection members. Further, the factors of interference with the vibration of the piezoelectric element P2 are decreased so that the efficiency of the vibration can be improved.

The longitudinal center of the piezoelectric layer 1 is the node of the first mode stretching vibration, i.e., a stress-concentrated part at which the stress caused by the stretching vibration concentrates. In this stress-concentrated part, electric charge concentrates due to the piezoelectric effect. In view of such, the first connection electrode J1 and the second connection electrode J2 have a shape elongated in the lateral direction at the longitudinal center of the principal surface of the piezoelectric layer 1. Therefore, the power supply electrodes 2 can have an increased area at the longitudinal center of the piezoelectric layer 1. By increasing the areas of the first connection electrode J1 and the second connection electrode J2, large stretching vibration can be induced even when the size of the piezoelectric element P2 is reduced. As a result, the efficiency of the ultrasonic actuator can be improved.

Embodiment 2 can also provide effects and advantages substantially equivalent to those of embodiment 1.

Embodiment 3

An ultrasonic actuator according to embodiment 3 of the present invention is now described. Note that elements equivalent to those described in the above embodiment are denoted by the same reference characters, and the description thereof is herein omitted. The ultrasonic actuator of embodiment 3 is different from embodiment 1 in the configurations of the piezoelectric element and the flexible cables.

3.1: Piezoelectric Element P3

The piezoelectric element P3 of this embodiment is in the shape of a generally rectangular parallelepiped. The piezoelectric element P3 includes a plurality of generally rectangular piezoelectric layers 1, and internal electrode layers interposed between the piezoelectric layers 1. The piezoelectric element P3 includes the piezoelectric layers and the electrode layers which are stacked in a direction from front to back of the drawing sheet of FIG. 1.

Figure 12:
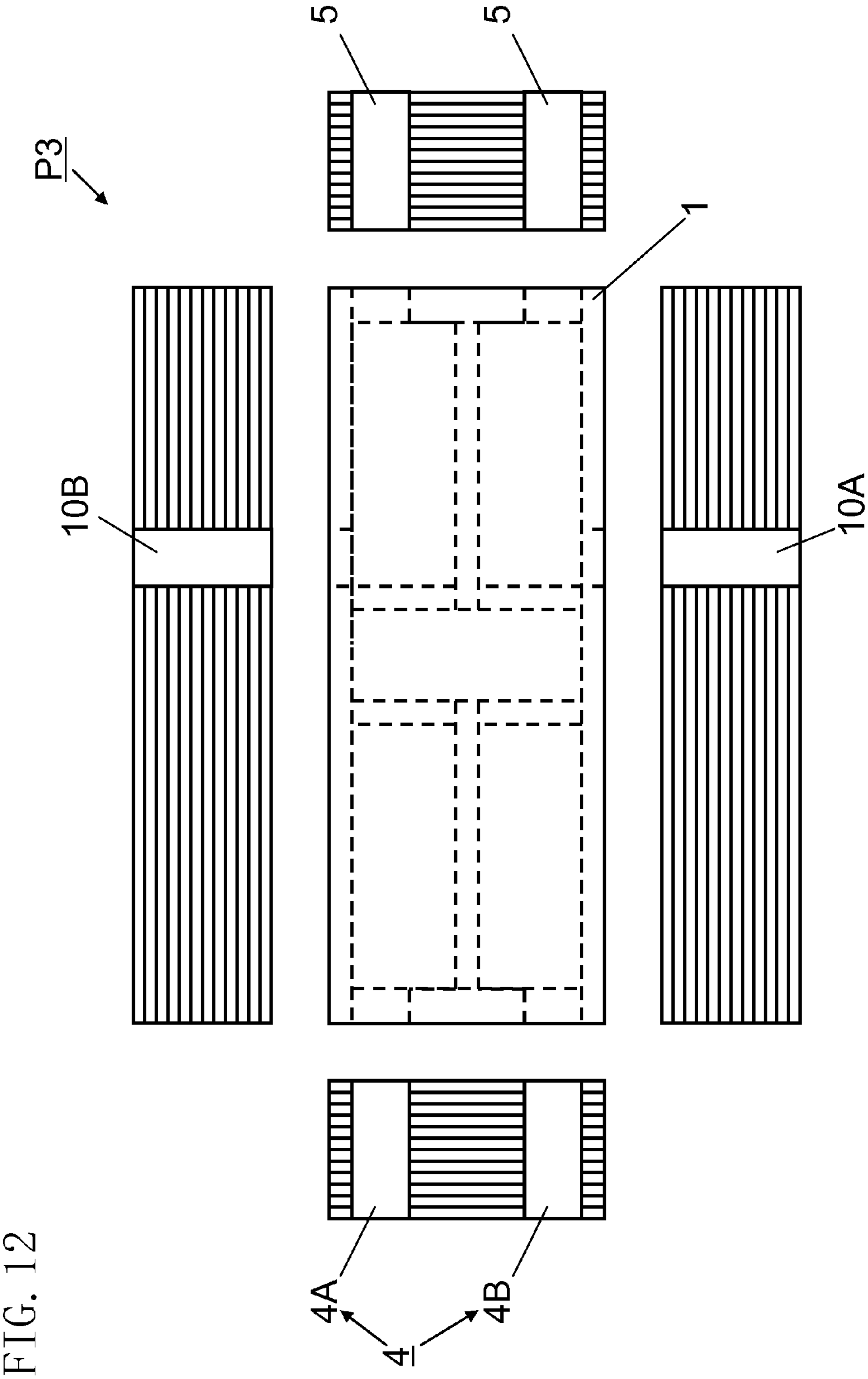
FIG. 12 is an orthographic developed view of the piezoelectric element P3 according to embodiment 3.

FIG. 12 is an orthographic developed view of the piezoelectric element P3. FIG. 13 shows the respective layers of the piezoelectric element P3 which are seen in the layer stacking direction. In FIG. 12, a portion at the center represents the principal surface, portions on the right and left sides of the principal surface are the short-side surfaces, and portions on the upper and lower sides of the principal surface are the long-side surfaces. The internal electrode layers are behind the principal surface and thus cannot be seen. The positions of the internal electrode layers projected over the principal surface are represented by broken lines.

As shown in FIG. 12, power supply external electrodes 4 and counter external electrodes 5 are provided on the short-side surfaces of the piezoelectric element P3. Specifically, the power supply external electrodes 4 include a first power supply external electrode 4A and a second power supply external electrode 4B which are mutually separate. The first power supply external electrode 4A and the second power supply external electrode 4B are provided on one of the two short-side surfaces of the piezoelectric element P3. The piezoelectric element P3 includes the two counter external electrodes 5 which are provided on the other one of the two short-side surfaces. These electrodes 4A, 4B and 5 are mutually insulated. In other words, the electrodes 4A, 4B and 5 are not electrically coupled to one another. One of the long-side surfaces of the piezoelectric element P3 is provided with a first connection external electrode 10A, and the other long-side surface is provided with a second connection external electrode 10B. The first connection external electrode 10A and the second connection external electrode 10B are mutually insulated.

Figures 13A, 13B, 13C, 13D:
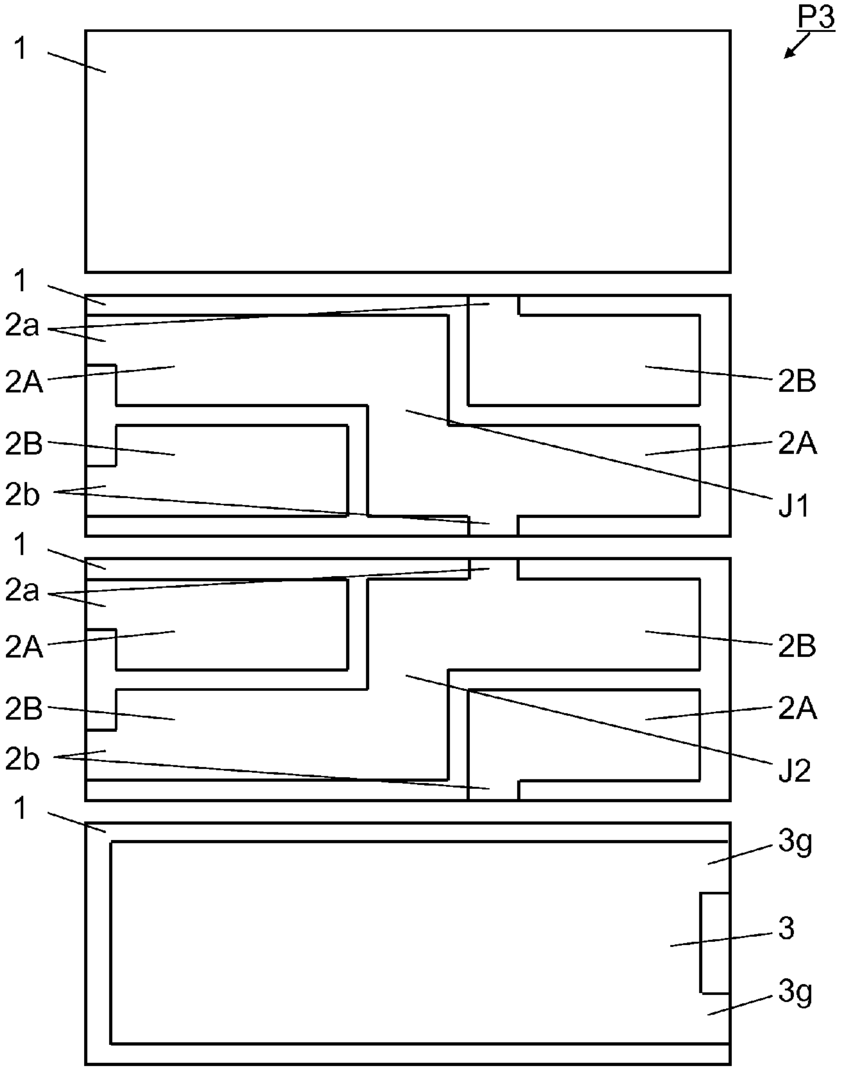
FIGS. 13A, 13B, 13C and 13D show the layers of the piezoelectric element P3 of embodiment 3 which are seen in the layer stacking direction.

The power supply electrodes 2 are provided on the principal surface of at least one of the plurality of piezoelectric layers 1 as shown in FIG. 13(B) and FIG. 13(C). Specifically, the power supply electrodes 2 are provided on the principal surface of at least one of the plurality of piezoelectric layers 1 in the first pattern as shown in FIG. 13(B). On the principal surface of another one of the plurality of piezoelectric layers 1 different from the piezoelectric layer 1 on which the power supply electrodes 2 are provided in the first pattern, the power supply electrodes 2 are provided in the second pattern as shown in FIG. 13(C) which is different from the first pattern.

Specifically, the power supply electrodes 2 formed in the first pattern and in the second pattern each include first power supply electrodes 2A and second power supply electrodes 2B which are not electrically coupled to the first power supply electrodes 2A.

In each of the first and second patterns, among four divisional regions A1-A4 (see FIG. 4) of the principal surface of the piezoelectric layer 1 which are defined by halving the principal surface with respect to both longitudinal direction L and lateral direction S, the first power supply electrodes 2A are provided in two of the four divisional regions A1-A4 which are aligned in the first diagonal direction D1 of the principal surface of the piezoelectric layer 1, i.e., in the divisional regions A2 and A4. The second power supply electrodes 2B are provided in the other two of the four divisional regions A1-A4 which are aligned in the second diagonal direction D2 of the principal surface of the piezoelectric layer 1, i.e., in the divisional regions A1 and A3.

The first pattern power supply electrodes 2 include a first connection electrode J1 extending in the lateral direction at the longitudinal center of the principal surface of the piezoelectric layer 1. The first power supply electrodes 2A provided in the two divisional regions A2 and A4 of the first pattern are mutually coupled via the first connection electrode J1. The second pattern power supply electrodes 2 include a second connection electrode J2 extending in the lateral direction at the longitudinal center of the principal surface of the piezoelectric layer 1. The second power supply electrodes 2B provided in the two divisional regions A1 and A3 of the second pattern are mutually coupled via the second connection electrode J2.

In each of the first and second patterns, among the first power supply electrodes 2A provided in the two divisional regions A2 and A4, the first power supply electrode 2A provided in the divisional region A2 which is closer to the short-side surface that has the first power supply external electrode 4A thereon includes a first power supply lead electrode 2*a* extending to the first power supply external electrode 4A. In this way, the first power supply electrode 2A of the divisional region A2 is electrically coupled to the first power supply external electrode 4A via the first power supply lead electrode 2*a*. Among the first power supply electrodes 2A provided in the two divisional regions A2 and A4, the first power supply electrode 2A provided in the divisional region A4 which is more distant from the short-side surface that has the first power supply external electrode 4A thereon includes a first power supply lead electrode 2*a* extending to the first connection external electrode 10A provided on the long-side surface. In this way, the first power supply electrodes 2A of the divisional region A4 in the different piezoelectric layers 1 are electrically coupled to each other via the first connection external electrode 10A. Since in the first pattern the first power supply electrode 2A of the divisional region A4 is electrically coupled to the first power supply electrode 2A of the divisional region A2 via the first connection electrode J1, the first power supply electrode 2A of the divisional region A4 of the second pattern, which is electrically coupled to the first power supply electrode 2A of the divisional region A4 of the first pattern via the first connection external electrode 10A, is electrically coupled to the first power supply external electrode 4A of the first pattern via the first connection electrode J1.

In each of the first and second patterns, among the second power supply electrodes 2B provided in the two divisional regions A1 and A3, the second power supply electrode 2B provided in the divisional region A3 which is closer to the short-side surface that has the second power supply external electrode 4B thereon includes a second power supply lead electrode 2*b* extending to the second power supply external electrode 4B. In this way, the second power supply electrode 2B of the divisional region A3 is electrically coupled to the second power supply external electrode 4B via the second power supply lead electrode 2*b*. Among the second power supply electrodes 2B provided in the two divisional regions A1 and A3, the second power supply electrode 2B provided in the divisional region A1 which is more distant from the short-side surface that has the second power supply external electrode 4B thereon includes a second power supply lead electrode 2*b* extending to the second connection external electrode 10B provided on the long-side surface. In this way, the second power supply electrodes 2B of the divisional region A1 in the different piezoelectric layers 1 are electrically coupled to each other via the second connection external electrode 10B. Since in the second pattern the second power supply electrode 2B of the divisional region A1 is electrically coupled to the second power supply electrode 2B of the divisional region A3 via the second connection electrode J2, the second power supply electrode 2B of the divisional region A1 of the first pattern, which is electrically coupled to the second power supply electrode 2B of the divisional region A1 of the second pattern via the second connection external electrode 10B, is electrically coupled to the second power supply external electrode 4B via the second connection electrode J2 of the second pattern.

The counter electrode 3 is provided over substantially the entire principal surface of the piezoelectric layer 1 as shown in FIG. 13(D). Specifically, the counter electrode 3 is not provided in a circumferential region of the principal surface of the piezoelectric layer 1 but is provided over substantially the entirety of a region inside the circumferential region. The counter electrode 3 includes counter lead electrodes 3*g* which extend from both ends of a short-side near the short-side surface on which the counter external electrodes 5 are provided toward the counter external electrodes 5 so as to be connected to the counter external electrodes 5. In this way, the counter electrode 3 is electrically coupled to the counter external electrodes 5 via the counter lead electrodes 3*g*. The counter electrodes 3 provided on different piezoelectric layers 1 are electrically coupled to each other via the counter lead electrodes 3*g* and the counter external electrodes 5.

The piezoelectric element P3 is formed by stacking the piezoelectric layers 1 provided with the power supply electrodes 2 or the counter electrode 3 on the principal surfaces as described above. Specifically, the plurality of piezoelectric layers 1 are sequentially stacked in the order of the piezoelectric layer 1 provided with the first pattern power supply electrodes 2, the piezoelectric layer 1 provided with the counter electrode 3, the piezoelectric layer 1 provided with the second pattern power supply electrodes 2, the piezoelectric layer 1 provided with the counter electrode 3, the piezoelectric layer 1 provided with the first pattern power supply electrodes 2, the piezoelectric layer 1 provided with the counter electrode 3, . . . . The piezoelectric layers 1 are stacked such that the principal surfaces provided with the power supply electrodes 2 or the counter electrode 3 are oriented in the same direction, i.e., such that the principal surface of one of the piezoelectric layers 1 on which the power supply electrodes 2 or the counter electrode 3 is provided faces the principal surface of another one of the piezoelectric layers 1 on which none of the power supply electrodes 2 and the counter electrode 3 is provided. Note that, the first and/or last of the stacked layers are the piezoelectric layers 1 which are not provided with the power supply electrodes 2 or the counter electrode 3 such that the power supply electrodes 2 or the counter electrode 3 would not be exposed.

As a result of stacking the piezoelectric layers 1, the power supply electrodes 2 and the counter electrode 3, each of the piezoelectric layers 1 is sandwiched by the power supply electrodes 2 (specifically, the first power supply electrode 2A and the second power supply electrode 2B) and the counter electrode 3. Thus, when seen in the stacking direction, the power supply electrodes 2 and the counter electrode 3 are overlapping with each other with the piezoelectric layer 1 interposed therebetween. Here, each of the piezoelectric layers 1 is polarized from the power supply electrode 2 side to the counter electrode 3 side.

However, the piezoelectric layers 1 include a region in which the power supply electrodes 2 and the counter electrode 3 are not overlapping when seen in the stacking direction (see FIG. 12). For example, the first power supply lead electrode 2*a*, the second power supply lead electrode 2*b*, and the counter lead electrodes 3*g* are not overlapping with the counter electrode 3 or the power supply electrodes 2 when seen in the stacking direction. In part of the piezoelectric layers 1 corresponding to the non-overlapping region, no electric field occurs. In other words, this part of the piezoelectric layers 1 is piezoelectrically inactive. Specifically, in part of the piezoelectric layers 1 near the short-side surfaces, the power supply electrodes 2 and the counter electrode 3 are not overlapping when seen in the stacking direction. This part of the piezoelectric layers 1 is piezoelectrically inactive.

The resonance frequency of the stretching vibration and the resonance frequency of the bending vibration of the piezoelectric element P3, which will be described later, depend on the material, the shape, etc., of the piezoelectric element P3. The material, the shape, etc., of the piezoelectric element P3 are determined such that the resonance frequency of the stretching vibration and the resonance frequency of the bending vibration are approximately equal to each other.

3.2: Electrical Connection Member

Figure 14:
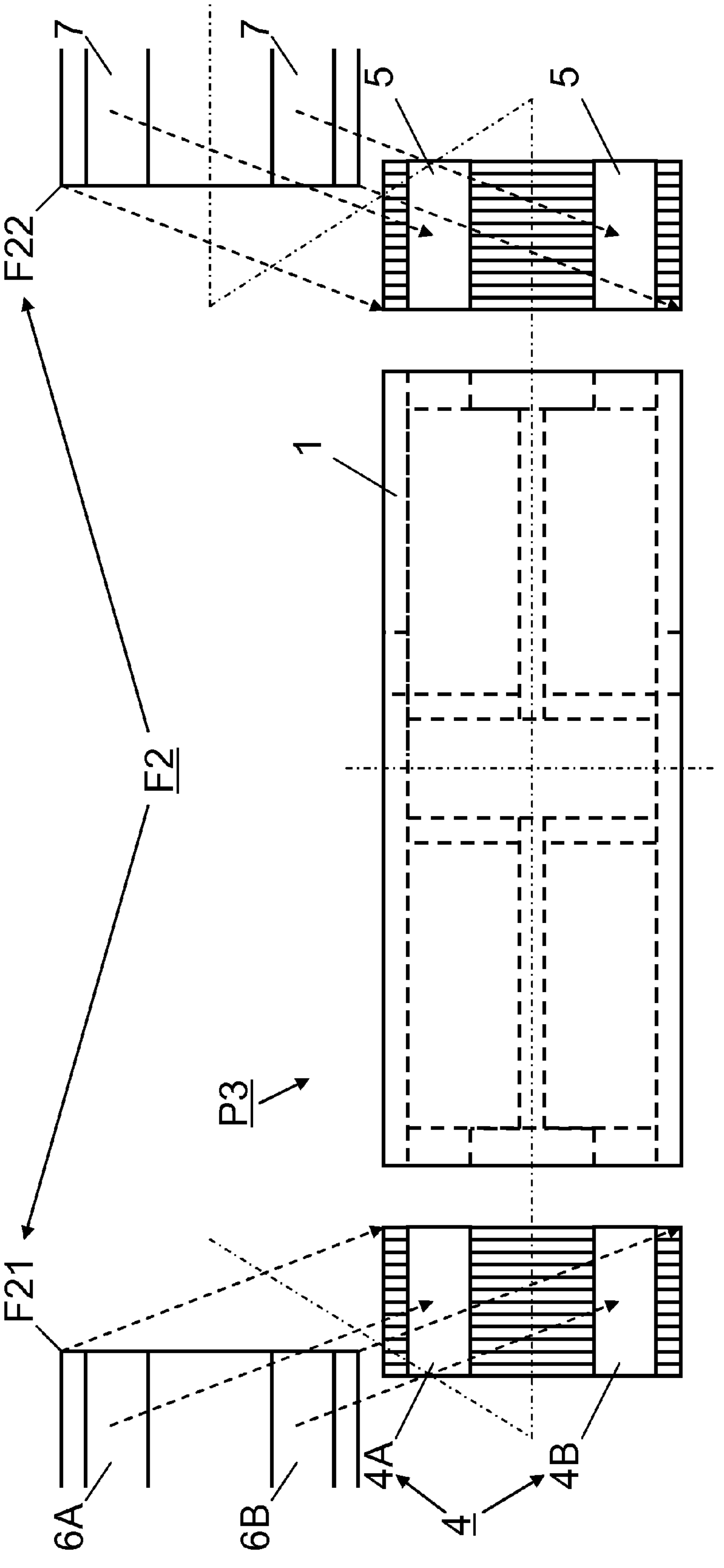
FIG. 14 shows the positional relationship for connection of flexible cables F2 and short-side surfaces of the piezoelectric element P3.

This embodiment uses the flexible cables F2 of embodiment 2 as the electrical connection members. FIG. 14 shows the positional relationship in connection between the first and second flexible cables F21 and F22 and the short-side surfaces of the piezoelectric element P3.

The relationship between the first and second flexible cables F21 and F22 and the other elements is the same as that in embodiment 2. For example, the relationship between the first flexible cable F21 and the piezoelectric element P3 is the same as the relationship between the first flexible cable F21 and the piezoelectric element P2 in embodiment 2. Note that the description of the electrical connection members of embodiment 3 is provided by applying the description of the <2.2: Electrical Connection Member> section of embodiment 2 of this specification mutatis mutandis to this section with "piezoelectric element P2" being replaced by "piezoelectric element P3" and "FIG. 11" being replaced by "FIG. 14".

Note that the first and second flexible cables F21 and F22 are not directly connected to the first connection external electrode 10A or the second connection external electrode 10B.

3.3: Operation of Ultrasonic Actuator

Hereinafter, an operation of the ultrasonic actuator is described. The operation of the ultrasonic actuator of this embodiment is basically the same as that of the ultrasonic actuator of embodiment 1. Specifically, a first driving voltage at a frequency near the substantially-matched resonance frequencies of the stretching vibration and the bending vibration of the piezoelectric element P3 is applied to the first power supply electrode 2A, and a second driving voltage which is approximately equal in amplitude and frequency to and different in phase by generally 90° or −90° from the first driving voltage is applied to the second power supply electrode 2B, whereby the first-order stretching vibration and the second-order bending vibration are harmonically induced in the piezoelectric element P3. As a result, the piezoelectric element P3 vibrates with its shape being sequentially deformed in the order of FIG. 8(A), FIG. 8(B), FIG. 8(C), and FIG. 8(D). The driver elements 8 provided on the piezoelectric element P3 make a revolutionary movement, specifically a generally-elliptic movement, when seen in the direction perpendicular to the surface of the sheet of FIG. 8. In other words, the composite vibration of the stretching vibration and bending vibration of the piezoelectric element P3 causes the driver elements 8 to make an elliptic movement. Due to this elliptic movement, the movable element 9 on which the driver elements 8 abut moves relative to the piezoelectric element P3.

In this example, the first connection external electrode 10A is provided on one of the two long-side surfaces of the piezoelectric element P3, and the second connection external electrode 10B is provided on the other one of the two long-side surfaces. Alternatively, the first connection external electrode 10A and the second connection external electrode 10B may be provided on the same long-side surface. In this case, the first connection external electrode 10A and the second connection external electrode 10B may preferably be provided on a long-side surface other than the long-side surface provided with the driver elements 8.

3.4: Advantages of Embodiment

According to this embodiment, as in embodiment 2, the first power supply external electrode 4A and the counter external electrodes 5 are provided at different short-side surfaces, and the second power supply external electrode 4B and the counter external electrodes 5 are provided at different short-side surfaces. This configuration ensures a sufficient distance between the first power supply external electrode 4A and the counter external electrodes 5 and between the second power supply external electrode 4B and the counter external electrodes 5. Accordingly, sufficient insulation can be ensured between the first power supply external electrode 4A and the counter external electrodes 5 and between the second power supply external electrode 4B and the counter external electrodes 5.

The first connection external electrode 10A is provided on one of the two long-side surfaces of the piezoelectric element P3, and the second connection external electrode 10B is provided on the other one of the two long-side surfaces. This configuration ensures sufficient insulation between the first connection external electrode 10A and the second connection external electrode 10B.

Embodiment 3 can also provide effects and advantages substantially equivalent to those of embodiments 1 and 2.

Embodiment 4

An ultrasonic actuator according to embodiment 4 of the present invention is now described. Note that elements equivalent to those described in the above embodiment are denoted by the same reference characters, and the description thereof is herein omitted. The ultrasonic actuator of embodiment 4 is different from embodiment 1 in the configurations of the piezoelectric element and the flexible cables.

4.1: Piezoelectric Element P4

The piezoelectric element P4 of this embodiment is in the shape of a generally rectangular parallelepiped. The piezoelectric element P4 includes a plurality of generally rectangular piezoelectric layers 1, and internal electrode layers interposed between the piezoelectric layers 1. The piezoelectric element P4 includes the piezoelectric layers and the electrode layers which are stacked in a direction from front to back of the drawing sheet of FIG. 1.

Figure 15:
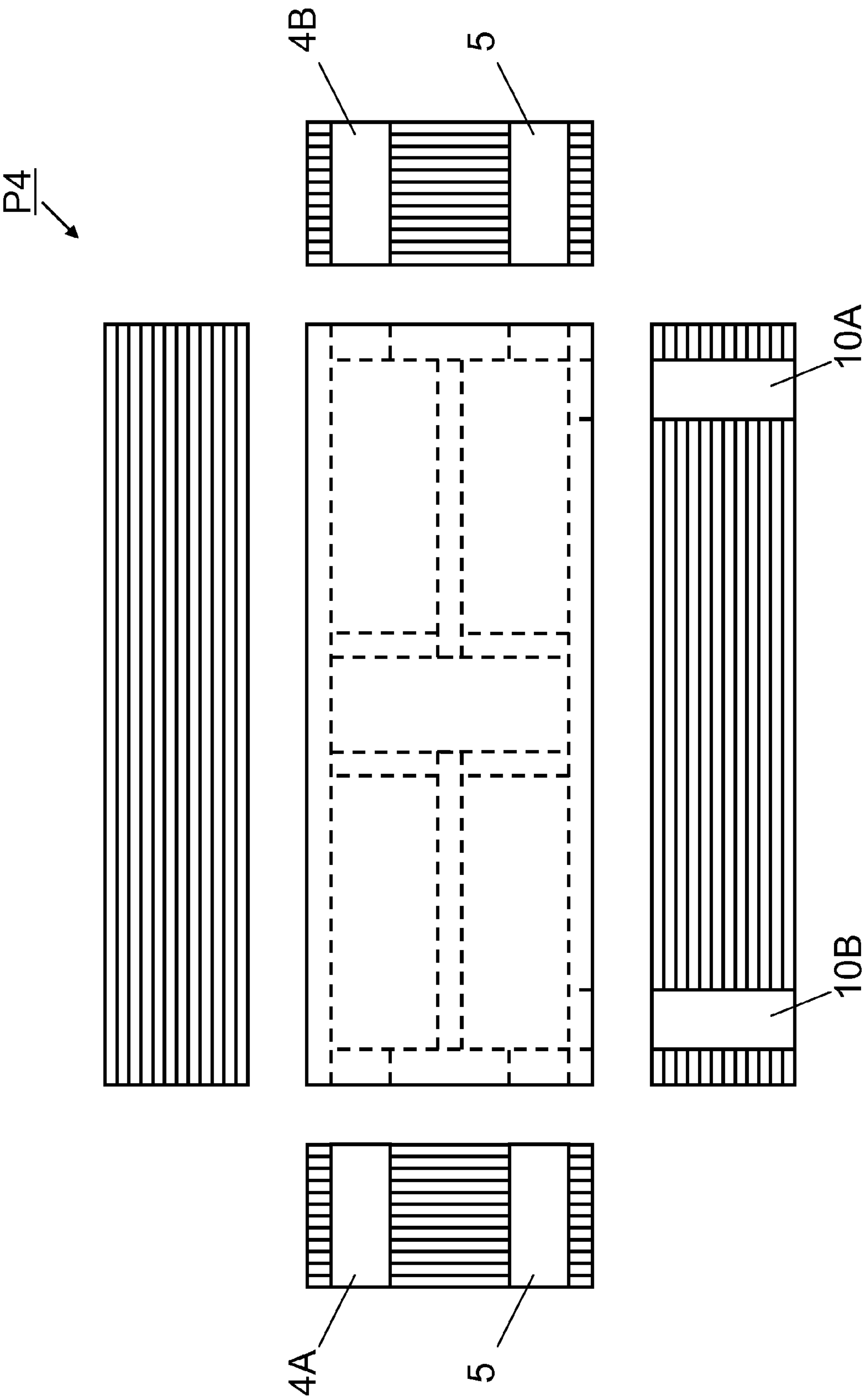
FIG. 15 is an orthographic developed view of the piezoelectric element P4 according to embodiment 4.

FIG. 15 is an orthographic developed view of the piezoelectric element P4. FIG. 16 shows the respective layers of the piezoelectric element P4 which are seen in the layer stacking direction. In FIG. 15, a portion at the center represents the principal surface, portions on the right and left sides of the principal surface are the short-side surfaces, and portions on the upper and lower sides of the principal surface are the long-side surfaces. The internal electrode layers are behind the principal surface and thus cannot be seen. The positions of the internal electrode layers projected over the principal surface are represented by broken lines.

As shown in FIG. 15, power supply external electrodes 4 and counter external electrodes 5 are provided on the short-side surfaces of the piezoelectric element P4. Specifically, the power supply external electrodes 4 include a first power supply external electrode 4A and a second power supply external electrode 4B which are mutually separate. The first power supply external electrode 4A is provided on one of the two short-side surfaces of the piezoelectric element P4. The second power supply external electrode 4B is provided on the other one of the two short-side surfaces of the piezoelectric element P4. The piezoelectric element P4 includes the two counter external electrodes 5 which are respectively provided on the two short-side surfaces in a one-to-one fashion. Specifically, on one of the short-side surfaces of the piezoelectric element P4, the counter external electrode 5 is provided at one lateral end of the piezoelectric element P4, and the first power supply external electrode 4A is provided at the other lateral end. On the other one of the short-side surfaces of the piezoelectric element P4, the counter external electrode 5 is provided at one lateral end of the piezoelectric element P4, and the second power supply external electrode 4B is provided at the other lateral end. These electrodes 4A, 4B and 5 are mutually insulated. In other words, the electrodes 4A, 4B and 5 are not electrically coupled to one another. On one of the long-side surfaces of the piezoelectric element P4, a second connection external electrode 10B is provided at one longitudinal end of the piezoelectric element P4, and a first connection external electrode 10A is provided at the other longitudinal end. The first connection external electrode 10A and the second connection external electrode 10B are mutually insulated.

Figures 16A, 16B, 16C, 16D:
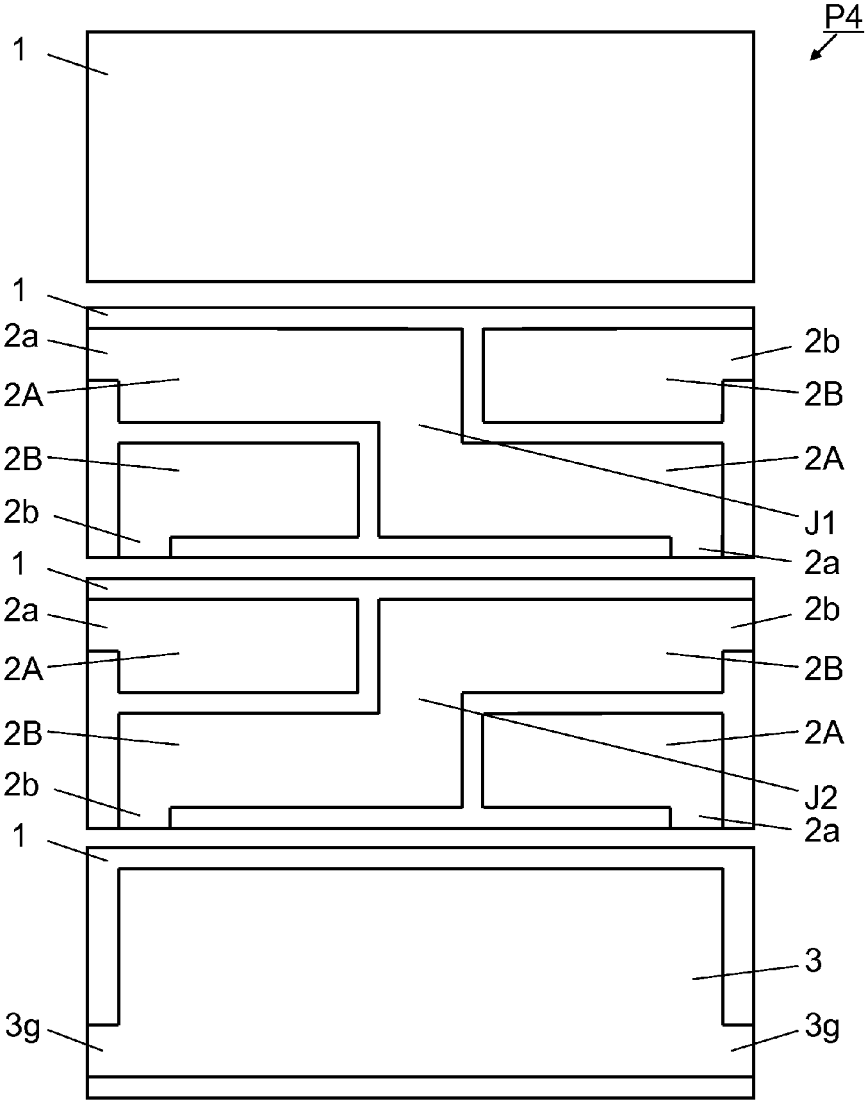
FIGS. 16A, 16B, 16C and 16D show the layers of the piezoelectric element P4 of embodiment 4 which are seen in the layer stacking direction.

The power supply electrodes 2 are provided on the principal surface of at least one of the plurality of piezoelectric layers 1 as shown in FIG. 16(B) and FIG. 16(C). Specifically, the power supply electrodes 2 are provided on the principal surface of at least one of the plurality of piezoelectric layers 1 in the first pattern as shown in FIG. 16(B). On the principal surface of another one of the plurality of piezoelectric layers 1 different from the piezoelectric layer 1 on which the power supply electrodes 2 are provided in the first pattern, the power supply electrodes 2 are provided in the second pattern as shown in FIG. 16(C) which is different from the first pattern.

Specifically, the power supply electrodes 2 formed in the first pattern and in the second pattern each include first power supply electrodes 2A and second power supply electrodes 2B which are not electrically coupled to the first power supply electrodes 2A.

In each of the first and second patterns, among four divisional regions A1-A4 (see FIG. 4) of the principal surface of the piezoelectric layer 1 which are defined by halving the principal surface with respect to both longitudinal direction L and lateral direction S, the first power supply electrodes 2A are provided in two of the four divisional regions A1-A4 which are aligned in the first diagonal direction D1 of the principal surface of the piezoelectric layer 1, i.e., in the divisional regions A2 and A4. The second power supply electrodes 2B are provided in the other two of the four divisional regions A1-A4 which are aligned in the second diagonal direction D2 of the principal surface of the piezoelectric layer 1, i.e., in the divisional regions A1 and A3.

The first pattern power supply electrodes 2 include a first connection electrode J1 extending in the lateral direction at the longitudinal center of the principal surface of the piezoelectric layer 1. The first power supply electrodes 2A provided in the two divisional regions A2 and A4 of the first pattern are mutually coupled via the first connection electrode J1. The second pattern power supply electrodes 2 include a second connection electrode J2 extending in the lateral direction at the longitudinal center of the principal surface of the piezoelectric layer 1. The second power supply electrodes 2B provided in the two divisional regions A1 and A3 of the second pattern are mutually coupled via the second connection electrode J2.

In each of the first and second patterns, among the first power supply electrodes 2A provided in the two divisional regions A2 and A4, the first power supply electrode 2A provided in the divisional region A2 which is closer to the short-side surface that has the first power supply external electrode 4A thereon includes a first power supply lead electrode 2*a* extending to the first power supply external electrode 4A. In this way, the first power supply electrode 2A of the divisional region A2 is electrically coupled to the first power supply external electrode 4A via the first power supply lead electrode 2*a*. Among the first power supply electrodes 2A provided in the two divisional regions A2 and A4, the first power supply electrode 2A provided in the divisional region A4 which is more distant from the short-side surface that has the first power supply external electrode 4A thereon includes a first power supply lead electrode 2*a* extending to the first connection external electrode 10A provided on the long-side surface. In this way, the first power supply electrodes 2A of the divisional region A4 in the different piezoelectric layers 1 are electrically coupled to each other via the first connection external electrode 10A. Since in the first pattern the first power supply electrode 2A of the divisional region A4 is electrically coupled to the first power supply electrode 2A of the divisional region A2 via the first connection electrode J1, the first power supply electrode 2A of the divisional region A4 of the second pattern, which is electrically coupled to the first power supply electrode 2A of the divisional region A4 of the first pattern via the first connection external electrode 10A, is electrically coupled to the first power supply external electrode 4A of the first pattern via the first connection electrode J1.

In each of the first and second patterns, among the second power supply electrodes 2B provided in the two divisional regions A1 and A3, the second power supply electrode 2B provided in the divisional region A3 which is closer to the short-side surface that has the second power supply external electrode 4B thereon includes a second power supply lead electrode 2*b* extending to the second power supply external electrode 4B. In this way, the second power supply electrode 2B of the divisional region A3 is electrically coupled to the second power supply external electrode 4B via the second power supply lead electrode 2*b*. Among the second power supply electrodes 2B provided in the two divisional regions A1 and A3, the second power supply electrode 2B provided in the divisional region A3 which is more distant from the short-side surface that has the second power supply external electrode 4B thereon includes a second power supply lead electrode 2*b* extending to the second connection external electrode 10B provided on the long-side surface. In this way, the second power supply electrodes 2B of the divisional region A1 in the different piezoelectric layers 1 are electrically coupled to each other via the second connection external electrode 10B. Since in the second pattern the second power supply electrode 2B of the divisional region A1 is electrically coupled to the second power supply electrode 2B of the divisional region A3 via the second connection electrode J2, the second power supply electrode 2B of the divisional region A1 of the first pattern, which is electrically coupled to the second power supply electrode 2B of the divisional region A1 of the second pattern via the second connection external electrode 10B, is electrically coupled to the second power supply external electrode 4B via the second connection electrode J2 of the second pattern.

The counter electrode 3 is provided over substantially the entire surface of the piezoelectric layer 1 as shown in FIG. 16(D). Specifically, the counter electrode 3 is not provided in a circumferential region of the principal surface of the piezoelectric layer 1 but is provided over substantially the entirety of a region inside the circumferential region. The counter electrode 3 includes counter lead electrodes 3*g* which extend from one lateral end to the counter external electrodes 5 provided on both short-side surfaces of the piezoelectric element P4. In this way, the counter electrode 3 is electrically coupled to the counter external electrodes 5 via the counter lead electrodes 3*g*. The counter electrodes 3 provided on different piezoelectric layers 1 are electrically coupled to each other via the counter lead electrodes 3*g* and the counter external electrodes 5.

The piezoelectric element P4 is formed by stacking the piezoelectric layers 1 provided with the power supply electrodes 2 or the counter electrode 3 on the principal surfaces as described above. Specifically, the plurality of piezoelectric layers 1 are sequentially stacked in the order of the piezoelectric layer 1 provided with the first pattern power supply electrodes 2, the piezoelectric layer 1 provided with the counter electrode 3, the piezoelectric layer 1 provided with the second pattern power supply electrodes 2, the piezoelectric layer 1 provided with the counter electrode 3, the piezoelectric layer 1 provided with the first pattern power supply electrodes 2, the piezoelectric layer 1 provided with the counter electrode 3, . . . . The piezoelectric layers 1 are stacked such that the principal surfaces provided with the power supply electrodes 2 or the counter electrode 3 are oriented in the same direction, i.e., such that the principal surface of one of the piezoelectric layers 1 on which the power supply electrodes 2 or the counter electrode 3 is provided face the principal surface of another one of the piezoelectric layers 1 on which none of the power supply electrodes 2 and the counter electrode 3 is provided. Note that, the first and/or last of the stacked layers are the piezoelectric layers 1 which are not provided with the power supply electrodes 2 or the counter electrode 3 such that the power supply electrodes 2 or the counter electrode 3 would not be exposed.

As a result of stacking the piezoelectric layers 1, the power supply electrodes 2 and the counter electrode 3, each of the piezoelectric layers 1 is sandwiched by the power supply electrodes 2 (specifically, the first power supply electrode 2A and the second power supply electrode 2B) and the counter electrode 3. Thus, when seen in the stacking direction, the power supply electrodes 2 and the counter electrode 3 are overlapping with each other with the piezoelectric layer 1 interposed therebetween. Here, each of the piezoelectric layers 1 is polarized from the power supply electrode 2 side to the counter electrode 3 side.

However, the piezoelectric layers 1 include a region in which the power supply electrodes 2 and the counter electrode 3 are not overlapping when seen in the stacking direction (see FIG. 15). For example, the first power supply lead electrode 2*a*, the second power supply lead electrode 2*b*, and the counter lead electrodes 3*g* are not overlapping with the counter electrode 3 or the power supply electrodes 2 when seen in the stacking direction. In part of the piezoelectric layers 1 corresponding to the non-overlapping region, no electric field occurs. In other words, this part of the piezoelectric layers 1 is piezoelectrically inactive. Specifically, in part of the piezoelectric layers 1 near the short-side surfaces, the power supply electrodes 2 and the counter electrode 3 are not overlapping when seen in the stacking direction. This part of the piezoelectric layers 1 is piezoelectrically inactive.

The resonance frequency of the stretching vibration and the resonance frequency of the bending vibration of the piezoelectric element P4, which will be described later, depend on the material, the shape, etc., of the piezoelectric element P4. The material, the shape, etc., of the piezoelectric element P4 are determined such that the resonance frequency of the stretching vibration and the resonance frequency of the bending vibration are approximately equal to each other.

4.2: Electrical Connection Member

In this embodiment, flexible cables F4 are used as the electrical connection member. The flexible cables F4 include a first flexible cable F41 and a second flexible cable F42. As shown in FIG. 1, the first flexible cable F41 and the second flexible cable F42 are electrically connected to the respective short-side surfaces of the piezoelectric element P4. The first flexible cable F41 and the second flexible cable F42 are electrically coupled to the piezoelectric element P4. The first flexible cable F41 and the second flexible cable F42 have substantially the same shape.

Figure 17:
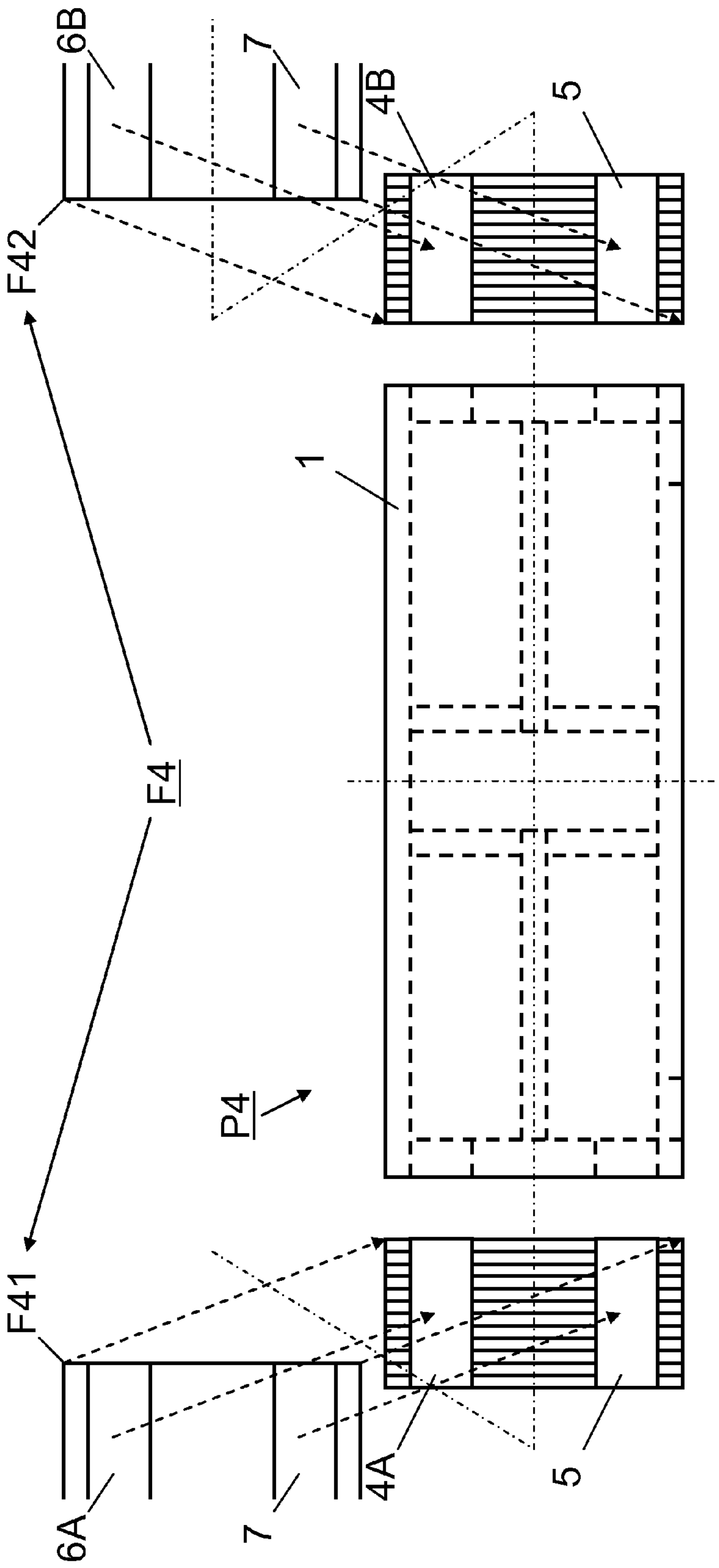
FIG. 17 shows the positional relationship for connection of flexible cables F4 and short-side surfaces of the piezoelectric element P4.

FIG. 17 shows the positional relationship in connection between the first and second flexible cables F41 and F42 and the short-side surfaces of the piezoelectric element P4. As shown in FIG. 17, the first and second flexible cables F41 and F42 include a plurality of electric wires formed by printing copper over an insulative resin substrate. The electric wires are mutually insulated.

The first flexible cable F41 is connected to one of the short-side surfaces of the piezoelectric element P4. The second flexible cable F42 is connected to the other one of the short-side surfaces of the piezoelectric element P4. The first and second flexible cables F41 and F42 each include an electric line 6 connected to the power supply external electrode 4 and an electric line 7 connected to the counter external electrode 5. Specifically, the first flexible cable F41 has an electric line 6A connected to the first power supply external electrode 4A and an electric line 7 connected to the counter external electrode 5. The second flexible cable F42 has an electric line 6B connected to the second power supply external electrode 4B and an electric line 7 connected to the counter external electrode 5.

Note that the flexible cables F4 are not directly connected to the first connection external electrode 10A or the second connection external electrode 10B.

The first flexible cable F41 has a shape symmetrical about a plane which passes through the midpoints of the short sides of the principal plane of the piezoelectric layer 1 and which is perpendicular to the short-side surfaces. The second flexible cable F42 also has a shape symmetrical about the plane which passes through the midpoints of the short sides of the principal plane of the piezoelectric layer 1 and which is perpendicular to the short-side surfaces. The first flexible cable F41 and the second flexible cable F42 have a shape symmetrical about a plane which passes through the midpoints of the long sides of the principal plane of the piezoelectric layer 1 and which is perpendicular to the principal surface. A connecting portion of the first flexible cable F41 which is connected to the piezoelectric element P4 has a shape symmetrical about the plane which passes through the midpoints of the short sides of the principal plane of the piezoelectric layer 1 and which is perpendicular to the short-side surfaces. A connecting portion of the second flexible cable F42 which is connected to the piezoelectric element P4 also has a shape symmetrical about the plane which passes through the midpoints of the short sides of the principal plane of the piezoelectric layer 1 and which is perpendicular to the short-side surfaces. The connecting portion of the first flexible cable F41 which is connected to the piezoelectric element P4 and the connecting portion of the second flexible cable F42 which is connected to the piezoelectric element P4 have a shape symmetrical about the plane which passes through the midpoints of the long sides of the principal plane of the piezoelectric layer 1 and which is perpendicular to the principal surface.

In the connecting portions of the first and second flexible cables F41 and F42 and a connecting portion of the piezoelectric element P4, these elements are electrically connected and adhered using an anisotropic conductive adhesion sheet. The anisotropic conductive adhesion sheet is prepared by molding a resin containing electrically conductive particles dispersed therein into the form of a sheet. The anisotropic conductive adhesion sheet has an electric conductivity in the adhesion direction, i.e., in the sheet thickness direction, but lacks electric conductivity in the in-plane directions of the adhesion surface. Therefore, the plurality of electrodes provided over the short-side surfaces of the piezoelectric element P4 can be electrically connected to the respective electric lines of the first and second flexible cables F41 and F42 by a single anisotropic conductive adhesion sheet with the electrodes being mutually insulated. In the first step of the connection method, an anisotropic conductive sheet is sandwiched between the first and second flexible cables F41 and F42 made of polyimide and the piezoelectric element P4. Then, the first and second flexible cables F41 and F42 are pressed against the piezoelectric element P4 using a heated planar cautery. As a result, the first and second flexible cables F41 and F42 and the piezoelectric element P4 are electrically coupled by the electrically conductive particles and adhered by means of the resin of the anisotropic conductive adhesion sheet.

The connection portions of the first and second flexible cables F41 and F42 and the piezoelectric element P4 are respectively interposed between the supporting portion 13*a* and the piezoelectric element P4 and between the supporting portion 13*c* and the piezoelectric element P4. Specifically, the first flexible cable F41 is pressed by the supporting portion 13*a* against the piezoelectric element P4. The second flexible cable F42 is pressed by the supporting portion 13*c* against the piezoelectric element P4.

The electric lines 6 connected to the power supply external electrodes 4 are an example of the power supply conductive member. The electric line 6A connected to the first power supply external electrode 4A is an example of the first power supply conductive member. The electric line 6B connected to the second power supply external electrode 4B is an example of the second power supply conductive member. The electric lines 7 connected to the counter external electrodes 5 are an example of the counter conductive member. The first flexible cable F41 is an example of the first electrical connection member. The second flexible cable F42 is an example of the second electrical connection member.

The first and second flexible cables F41 and F42 are coupled to a power supply (not shown). A driving voltage from the power supply is applied to the piezoelectric element P4 via the first and second flexible cables F41 and F42 such that vibration is generated in the piezoelectric element P4.

4.3: Operation of Ultrasonic Actuator

Hereinafter, an operation of the ultrasonic actuator is described. The operation of the ultrasonic actuator of this embodiment is basically the same as that of the ultrasonic actuator of embodiment 1. Specifically, a first driving voltage at a frequency near the substantially-matched resonance frequencies of the stretching vibration and the bending vibration of the piezoelectric element P4 is applied to the first power supply electrode 2A, and a second driving voltage which is approximately equal in amplitude and frequency to and different in phase by generally 90° or −90° from the first driving voltage is applied to the second power supply electrode 2B, whereby the first-order stretching vibration and the second-order bending vibration are harmonically induced in the piezoelectric element P4. As a result, the piezoelectric element P4 vibrates with its shape being sequentially deformed in the order of FIG. 8(A), FIG. 8(B), FIG. 8(C), and FIG. 8(D). The driver elements 8 provided on the piezoelectric element P4 make a revolutionary movement, specifically a generally-elliptic movement, when seen in the direction perpendicular to the surface of the sheet of FIG. 8. In other words, the composite vibration of the stretching vibration and bending vibration of the piezoelectric element P4 causes the driver elements 8 to make an elliptic movement. Due to this elliptic movement, the movable element 9 on which the driver elements 8 abut moves relative to the piezoelectric element P4.

In this example, the first connection external electrode 10A and the second connection external electrode 10B are provided on the same long-side surface. Alternatively, the first and second connection external electrodes 10A and 10B may be provided on different long-side surfaces of the piezoelectric element P4.

4.4: Advantages of Embodiment

According to this embodiment, the first connection external electrode 10A and the second connection external electrode 10B are provided on the same long-side surface. Specifically, the long-side surface which has the driving elements 8 is not provided with the first connection external electrode 10A or the second connection external electrode 10B, and the other long-side surface which is different from the long-side surface that has the driving elements 8 thereon is provided with the first connection external electrode 10A and the second connection external electrode 10B. This configuration improves the flexibility of arrangement of the driving elements 8 such that the driving elements 8 are fixed at positions other than the first connection external electrode 10A or the second connection external electrode 10B.

Embodiment 4 can also provide effects and advantages substantially equivalent to those of embodiments 1 and 2.

Embodiment 5

An ultrasonic actuator according to embodiment 5 of the present invention is now described. Note that elements equivalent to those described in the above embodiment are denoted by the same reference characters, and the description thereof is herein omitted. The ultrasonic actuator of embodiment 5 is different from embodiment 1 in the configurations of the piezoelectric element and the flexible cables.

5.1: Piezoelectric Element P5

The piezoelectric element P5 of this embodiment is in the shape of a generally rectangular parallelepiped. The piezoelectric element P5 includes a plurality of generally rectangular piezoelectric layers 1, and internal electrode layers interposed between the piezoelectric layers 1. The piezoelectric element P5 includes the piezoelectric layers and the electrode layers which are stacked in a direction from front to back of the drawing sheet of FIG. 1.

Figure 18:
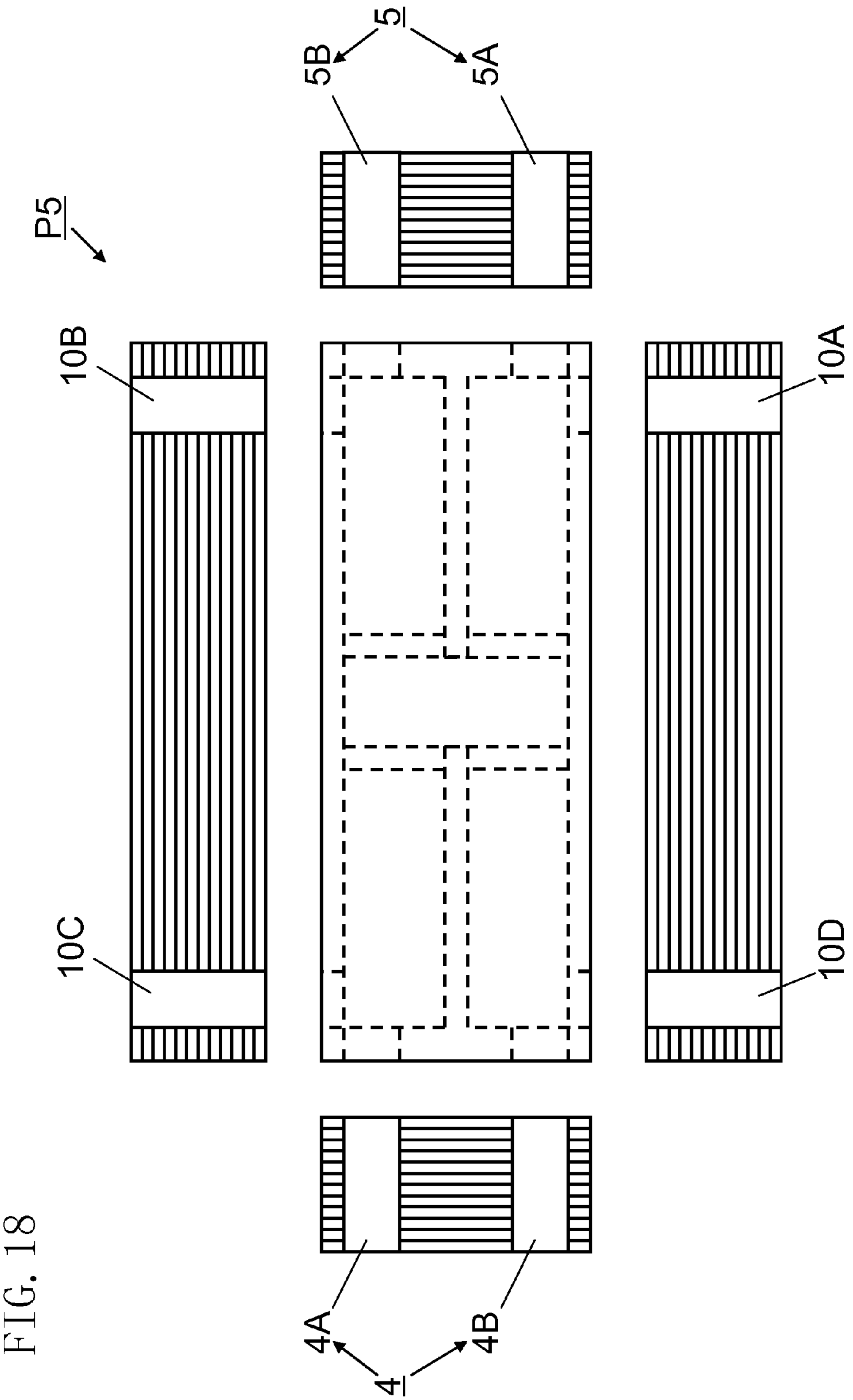
FIG. 18 is an orthographic developed view of the piezoelectric element P5 according to embodiment 5.

FIG. 18 is an orthographic developed view of the piezoelectric element P5. FIG. 19 shows the respective layers of the piezoelectric element P5 which are seen in the layer stacking direction. In FIG. 18, a portion at the center represents the principal surface, portions on the right and left sides of the principal surface are the short-side surfaces, and portions on the upper and lower sides of the principal surface are the long-side surfaces. The internal electrode layers are behind the principal surface and thus cannot be seen. The positions of the internal electrode layers projected over the principal surface are represented by broken lines.

As shown in FIG. 18, power supply external electrodes 4 and counter external electrodes 5 are provided on the short-side surfaces of the piezoelectric element P5. Specifically, the power supply external electrodes 4 include a first power supply external electrode 4A and a second power supply external electrode 4B which are mutually separate. The first power supply external electrode 4A and the second power supply external electrode 4B are provided on one of the two short-side surfaces of the piezoelectric element P5. The counter external electrodes 5 include a first counter external electrode 5A and a second counter external electrode 5B. The first counter external electrode 5A and the second counter external electrode 5B are provided on the other one of the two short-side surfaces of the piezoelectric element P5. The piezoelectric element P5 includes the two counter external electrodes 5 which are provided on the other one of the two short-side surfaces. These electrodes 4A, 4B, 5A, and 5B are mutually insulated. In other words, the electrodes 4A, 4B, 5A, and 5B are not electrically coupled to one another. A first connection external electrode 10A and a fourth connection external electrode 10D are provided on one of the long-side surfaces of the piezoelectric element P5. A second connection external electrode 10B and a third connection external electrode 10C are provided on the other one of the long-side surfaces of the piezoelectric element P5. The first through fourth connection external electrodes 10A-10D are mutually insulated. In other words, the first through fourth connection external electrodes 10A-10D are not electrically coupled to one another.

Figures 19A, 19B, 19C, 19D, 19E:
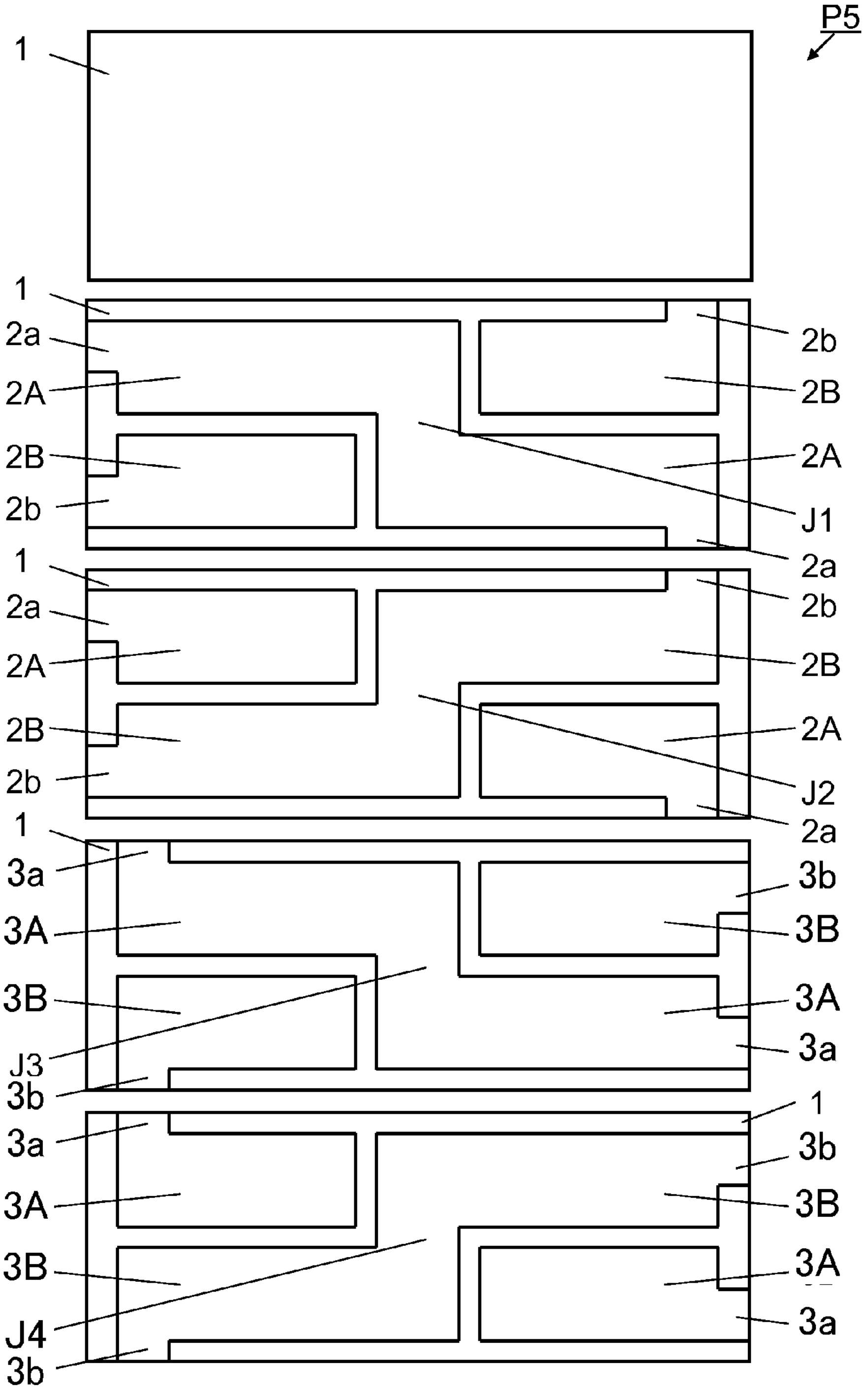
FIGS. 19A, 19B, 19C, 19D and 19E show the layers of the piezoelectric element P5 of embodiment 5 which are seen in the layer stacking direction.

The power supply electrodes 2 are provided on the principal surface of at least one of the plurality of piezoelectric layers 1 as shown in FIG. 19(B) and FIG. 19(C). Specifically, the power supply electrodes 2 are provided on the principal surface of at least one of the plurality of piezoelectric layers 1 in the first pattern as shown in FIG. 19(B). On the principal surface of another one of the plurality of piezoelectric layers 1 different from the piezoelectric layer 1 on which the power supply electrodes 2 are provided in the first pattern, the power supply electrodes 2 are provided in the second pattern as shown in FIG. 19(C) which is different from the first pattern.

Specifically, the power supply electrodes 2 formed in the first pattern and in the second pattern each include first power supply electrodes 2A and second power supply electrodes 2B which are not electrically coupled to the first power supply electrodes 2A.

In each of the first and second patterns, among four divisional regions A1-A4 (see FIG. 4) of the principal surface of the piezoelectric layer 1 which are defined by halving the principal surface with respect to both longitudinal direction L and lateral direction S, the first power supply electrodes 2A are provided in two of the four divisional regions A1-A4 which are aligned in the first diagonal direction D1 of the principal surface of the piezoelectric layer 1, i.e., in the divisional regions A2 and A4. The second power supply electrodes 2B are provided in the other two of the four divisional regions A1-A4 which are aligned in the second diagonal direction D2 of the principal surface of the piezoelectric layer 1, i.e., in the divisional regions A1 and A3.

The first pattern power supply electrodes 2 include a first connection electrode J1 extending in the lateral direction at the longitudinal center of the principal surface of the piezoelectric layer 1. The first power supply electrodes 2A provided in the two divisional regions A2 and A4 of the first pattern are mutually coupled via the first connection electrode J1. On the other hand, the second pattern power supply electrodes 2 include a second connection electrode J2 extending in the lateral direction at the longitudinal center of the principal surface of the piezoelectric layer 1. The second power supply electrodes 2B provided in the two divisional regions A1 and A3 of the second pattern are mutually coupled via the second connection electrode J2.

In each of the first and second patterns, among the first power supply electrodes 2A provided in the two divisional regions A2 and A4, the first power supply electrode 2A provided in the divisional region A2 which is closer to the short-side surface that has the first power supply external electrode 4A thereon includes a first power supply lead electrode 2*a* extending to the first power supply external electrode 4A. In this way, the first power supply electrode 2A of the divisional region A2 is electrically coupled to the first power supply external electrode 4A via the first power supply lead electrode 2*a*. Among the first power supply electrodes 2A provided in the two divisional regions A2 and A4, the first power supply electrode 2A provided in the divisional region A4 which is more distant from the short-side surface that has the first power supply external electrode 4A thereon includes a first power supply lead electrode 2*a* extending to the first connection external electrode 10A provided on the long-side surface. In this way, the first power supply electrodes 2A of the divisional region A4 in the different piezoelectric layers 1 are electrically coupled to each other via the first connection external electrode 10A. Since in the first pattern the first power supply electrode 2A of the divisional region A4 is electrically coupled to the first power supply electrode 2A of the divisional region A2 via the first connection electrode J1, the first power supply electrode 2A of the divisional region A4 of the second pattern, which is electrically coupled to the first power supply electrode 2A of the divisional region A4 of the first pattern via the first connection external electrode 10A, is electrically coupled to the first power supply external electrode 4A of the first pattern via the first connection electrode J1.

In each of the first and second patterns, among the second power supply electrodes 2B provided in the two divisional regions A1 and A3, the second power supply electrode 2B provided in the divisional region A3 which is closer to the short-side surface that has the second power supply external electrode 4B thereon includes a second power supply lead electrode 2*b* extending to the second power supply external electrode 4B. In this way, the second power supply electrode 2B of the divisional region A3 is electrically coupled to the second power supply external electrode 4B via the second power supply lead electrode 2*b*. Among the second power supply electrodes 2B provided in the two divisional regions A1 and A3, the second power supply electrode 2B provided in the divisional region A1 which is more distant from the short-side surface that has the second power supply external electrode 4B thereon includes a second power supply lead electrode 2*b* extending to the second connection external electrode 10B provided on the long-side surface. In this way, the second power supply electrodes 2B of the divisional region A1 in the different piezoelectric layers 1 are electrically coupled to each other via the second connection external electrode 10B. Since in the second pattern the second power supply electrode 2B of the divisional region A1 is electrically coupled to the second power supply electrode 2B of the divisional region A3 via the second connection electrode J2, the second power supply electrode 2B of the divisional region A1 of the first pattern, which is electrically coupled to the second power supply electrode 2B of the divisional region A1 of the second pattern via the second connection external electrode 10B, is electrically coupled to the second power supply external electrode 4B via the second connection electrode J2 of the second pattern.

The counter electrodes 3 are provided on the principal surface of at least one of the plurality of piezoelectric layers 1 on which the power supply electrodes 2 are not provided as shown in FIG. 19(D) and FIG. 19(E). Specifically, the counter electrodes 3 are provided in the third pattern on the principal surface of at least one of the plurality of piezoelectric layers 1 on which the power supply electrodes 2 are not provided as shown in FIG. 19(D). On the principal surface of another one of the plurality of piezoelectric layers 1 on which none of the power supply electrodes 2 and the third pattern counter electrodes 3 are provided, counter electrodes 3 are provided in the fourth pattern as shown in FIG. 19(E) which is different from the third pattern.

Specifically, the counter electrodes 3 formed in the third pattern and in the fourth pattern each include first counter electrodes 3A and second counter electrodes 3B which are not electrically coupled to the first counter electrodes 3A.

In each of the third and fourth patterns, among four divisional regions A1-A4 (see FIG. 4) of the principal surface of the piezoelectric layer 1 which are defined by halving the principal surface with respect to both longitudinal direction L and lateral direction S, the first counter electrodes 3A are provided in two of the four divisional regions A1-A4 which are aligned in the first diagonal direction D1 of the principal surface of the piezoelectric layer 1, i.e., in the divisional regions A2 and A4. The second counter electrodes 3B are provided in the other two of the four divisional regions A1-A4 which are aligned in the second diagonal direction D2 of the principal surface of the piezoelectric layer 1, i.e., in the divisional regions A1 and A3.

The third pattern counter electrodes 3 include a third connection electrode J3 extending in the lateral direction at the longitudinal center of the principal surface of the piezoelectric layer 1. The first counter electrodes 3A provided in the two divisional regions A2 and A4 of the third pattern are electrically coupled to each other via the third connection electrode J3. On the other hand, the fourth pattern counter electrodes 3 include a fourth connection electrode J4 extending in the lateral direction at the longitudinal center of the principal surface of the piezoelectric layer 1. The second counter electrodes 3B provided in the two divisional regions A1 and A3 of the fourth pattern are electrically coupled to each other via the fourth connection electrode J4.

In each of the third and fourth patterns, among the first counter electrodes 3A provided in the two divisional regions A2 and A4, the first counter electrodes 3A provided in the divisional region A4 which is closer to the short-side surface that has the first counter external electrode 5A thereon includes a first counter lead electrode 3*a* extending to the first counter external electrode 5A. In this way, the first counter electrode 3A of the divisional region A4 is electrically coupled to the first counter external electrode 5A via the first counter lead electrode 3*a*. Among the first counter electrodes 3A provided in the two divisional regions A2 and A4, the first counter electrode 3A provided in the divisional region A2 which is more distant from the short-side surface that has the first counter external electrode 5A thereon includes a first counter lead electrode 3*a* extending to the third connection external electrode 10C provided on the long-side surface. In this way, the first counter electrodes 3A of the divisional region A2 in the different piezoelectric layers 1 are electrically coupled to each other via the third connection external electrode 10C. Since in the third pattern the first counter electrode 3A of the divisional region A2 is electrically coupled to the first counter electrode 3A of the divisional region A4 via the third connection electrode J3, the first counter electrode 3A of the divisional region A2 of the fourth pattern, which is electrically coupled to the first counter electrode 3A of the divisional region A2 of the third pattern via the third connection external electrode 10C, is electrically coupled to the first counter external electrode 5A via the third connection electrode J3 of the third pattern.

In each of the third and fourth patterns, among the second counter electrodes 3B provided in the two divisional regions A1 and A3, the second counter electrode 3B provided in the divisional region A1 which is closer to the short-side surface that has the second counter external electrode 5B thereon includes a second counter lead electrode 3*b* extending to the second counter external electrode 5B. In this way, the second counter electrodes 3B of the divisional region A1 is electrically coupled to the second counter external electrode 5B via the second counter lead electrode 3*b*. Among the second counter electrodes 3B provided in the two divisional regions A1 and A3, the second counter electrode 3B provided in the divisional region A3 which is more distant from the short-side surface that has the second counter external electrode 5B thereon includes a second counter lead electrode 3*b* extending to the fourth connection external electrode 10D provided on the long-side surface. In this way, the second counter electrodes 3B of the divisional region A3 in the different piezoelectric layers 1 are electrically coupled to each other via the second connection external electrode 10B. Since in the fourth pattern the second counter electrode 3B of the divisional region A3 is electrically coupled to the second counter electrode 3B of the divisional region A1 via the fourth connection electrode J4, the second counter electrodes 3B of the divisional region A3 of the third pattern, which is electrically coupled to the second counter electrode 3B of the divisional region A3 of the fourth pattern via the fourth connection external electrode 10D, is electrically coupled to the second counter external electrode 5B via the fourth connection electrode J4 of the fourth pattern.

The piezoelectric element P5 is formed by stacking the piezoelectric layers 1 provided with the power supply electrodes 2 or the counter electrodes 3 on the principal surfaces as described above. Specifically, the plurality of piezoelectric layers 1 are sequentially stacked in the order of the piezoelectric layer 1 provided with the first pattern power supply electrodes 2, the piezoelectric layer 1 provided with the third pattern counter electrodes 3, the piezoelectric layer 1 provided with the second pattern power supply electrodes 2, the piezoelectric layer 1 provided with the fourth pattern counter electrodes 3, the piezoelectric layer 1 provided with the first pattern power supply electrodes 2, the piezoelectric layer 1 provided with the third pattern counter electrodes 3, . . . . The piezoelectric layers 1 are stacked such that the principal surfaces provided with the power supply electrodes 2 or the counter electrodes 3 are oriented in the same direction, i.e., such that the principal surface of one of the piezoelectric layers 1 on which the power supply electrodes 2 or the counter electrodes 3 are provided face the principal surface of another one of the piezoelectric layers 1 on which none of the power supply electrodes 2 and the counter electrodes 3 is provided. Note that, the first and/or last of the stacked layers are the piezoelectric layers 1 which are not provided with the power supply electrodes 2 or the counter electrodes 3 such that the power supply electrodes 2 or the counter electrodes 3 would not be exposed.

As a result of stacking the piezoelectric layers 1, the power supply electrodes 2 and the counter electrodes 3, each of the piezoelectric layers 1 is sandwiched by the power supply electrodes 2 and the counter electrodes 3. Thus, when seen in the stacking direction, the power supply electrodes 2 and the counter electrodes 3 are overlapping with each other with the piezoelectric layer 1 interposed therebetween. Here, each of the piezoelectric layers 1 is polarized from the power supply electrode 2 side to the counter electrode 3 side.

Specifically, the first power supply electrodes 2A are overlapping with the first counter electrodes 3A with the piezoelectric layer 1 interposed therebetween when seen in the stacking direction. The second power supply electrodes 2B are overlapping with the second counter electrodes 3B with the piezoelectric layer 1 interposed therebetween when seen in the stacking direction. The first connection electrode J1 is overlapping with the third connection electrode J3 with the piezoelectric layer 1 interposed therebetween when seen in the stacking direction. The second connection electrode J2 is overlapping with the fourth connection electrode J4 with the piezoelectric layer 1 interposed therebetween when seen in the stacking direction.

However, the piezoelectric layers 1 include a region in which the power supply electrodes 2 and the counter electrodes 3 are not overlapping when seen in the stacking direction (see FIG. 18). For example, the first and second power supply lead electrodes 2*a* and 2*b* and the counter lead electrodes 3*a* and 3*b* are not overlapping with the counter electrodes 3 or the power supply electrodes 2 when seen in the stacking direction. In part of the piezoelectric layers 1 corresponding to the non-overlapping region, no electric field occurs. In other words, this part of the piezoelectric layers 1 is piezoelectrically inactive. Specifically, in part of the piezoelectric layers 1 near the short-side surfaces, the power supply electrodes 2 and the counter electrodes 3 are not overlapping when seen in the stacking direction. This part of the piezoelectric layers 1 is piezoelectrically inactive.

The resonance frequency of the stretching vibration and the resonance frequency of the bending vibration of the piezoelectric element P5, which will be described later, depend on the material, the shape, etc., of the piezoelectric element P5. The material, the shape, etc., of the piezoelectric element P5 are determined such that the resonance frequency of the stretching vibration and the resonance frequency of the bending vibration are approximately equal to each other.

5.2: Electrical Connection Member

In this embodiment, flexible cables F5 are used as the electrical connection member. The flexible cables F5 include a first flexible cable F51 and a second flexible cable F52. As shown in FIG. 1, the first flexible cable F51 and the second flexible cable F52 are electrically connected to the respective short-side surfaces of the piezoelectric element P5. The first flexible cable F51 and the second flexible cable F52 are electrically connected to the piezoelectric element P5. The first flexible cable F51 and the second flexible cable F52 have substantially the same shape.

Figure 20:
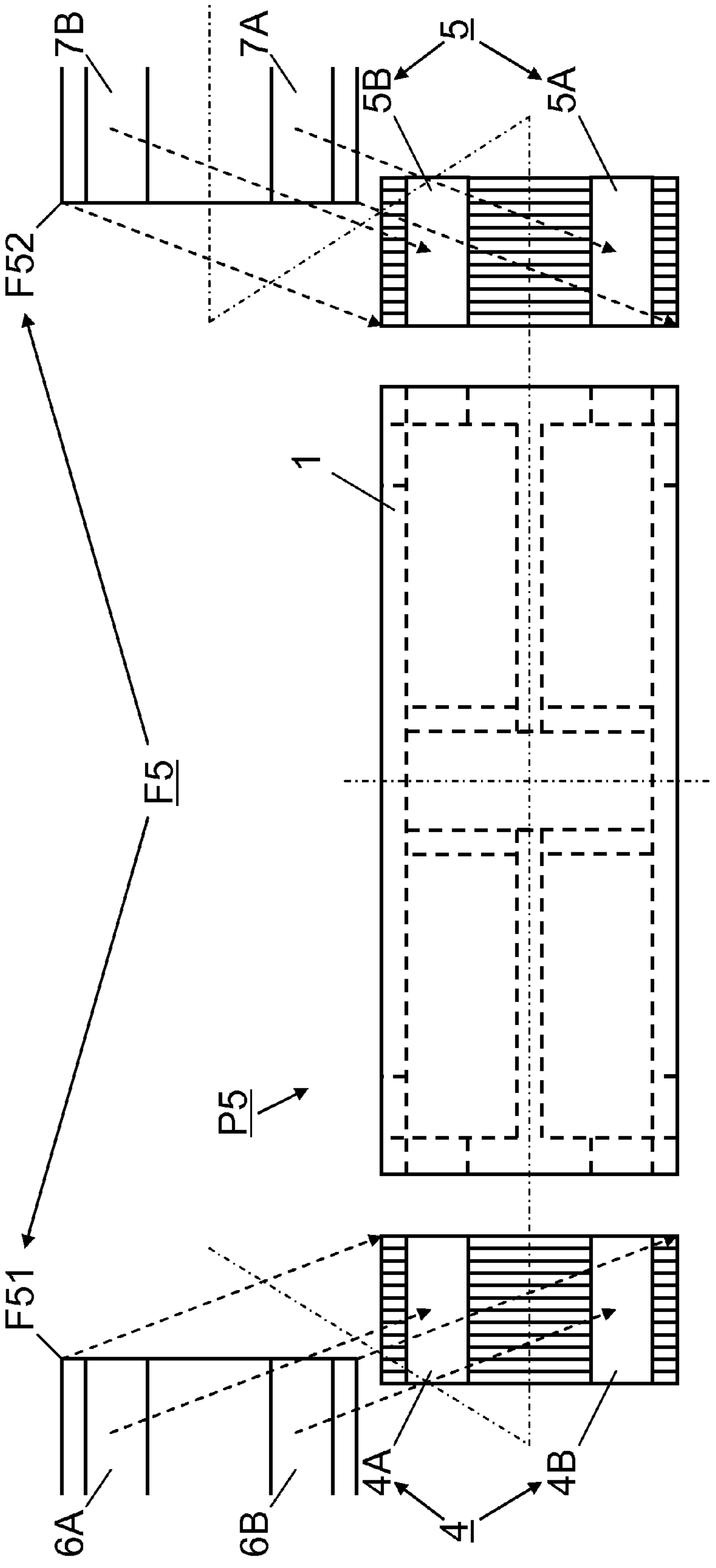
FIG. 20 shows the positional relationship for connection of flexible cables F5 and short-side surfaces of the piezoelectric element P5.

FIG. 20 shows the positional relationship in connection between the first and second flexible cables F51 and F52 and the lateral surfaces of the piezoelectric element P5. As shown in FIG. 20, the first and second flexible cables F51 and F52 include a plurality of electric wires formed by printing copper over an insulative resin substrate. The electric wires are mutually insulated.

The first flexible cable F51 is connected to one of the short-side surfaces of the piezoelectric element P5. The first flexible cable F51 includes electric lines 6 connected to the power supply external electrodes 4. Specifically, the first flexible cable F51 has an electric line 6A connected to the first power supply external electrode 4A and an electric line 6B connected to the second power supply external electrode 4B.

The second flexible cable F52 is connected to the other one of the short-side surfaces of the piezoelectric element P5. The second flexible cable F52 includes electric lines 7 connected to the counter external electrodes 5. Specifically, the second flexible cable F52 has an electric line 7A connected to the first counter external electrode 5A and an electric line 7B connected to the second counter external electrode 5B. The electric line 7A constitutes the first counter conductive member, and the electric line 7B constitutes the second counter conductive member.

Note that the flexible cables F5 are not directly connected to the first through fourth connection external electrodes 10A-10D.

The first flexible cable F51 has a shape symmetrical about a plane which passes through the midpoints of the short sides of the principal plane of the piezoelectric layer 1 and which is perpendicular to the short-side surfaces. The second flexible cable F52 also has a shape symmetrical about the plane which passes through the midpoints of the short sides of the principal plane of the piezoelectric layer 1 and which is perpendicular to the short-side surfaces. The first flexible cable F51 and the second flexible cable F52 have a shape symmetrical about a plane which passes through the midpoints of the long sides of the principal plane of the piezoelectric layer 1 and which is perpendicular to the principal surface. A connecting portion of the first flexible cable F51 which is connected to the piezoelectric element P5 has a shape symmetrical about the plane which passes through the midpoints of the short sides of the principal plane of the piezoelectric layer 1 and which is perpendicular to the short-side surfaces. A connecting portion of the second flexible cable F52 which is connected to the piezoelectric element P5 also has a shape symmetrical about the plane which passes through the midpoints of the short sides of the principal plane of the piezoelectric layer 1 and which is perpendicular to the short-side surfaces. The connecting portion of the first flexible cable F51 which is connected to the piezoelectric element P5 and the connecting portion of the second flexible cable F52 which is connected to the piezoelectric element P5 have a shape symmetrical about the plane which passes through the midpoints of the long sides of the principal plane of the piezoelectric layer 1 and which is perpendicular to the principal surface.

In the connecting portions of the first and second flexible cables F51 and F52 and a connecting portion of the piezoelectric element P5, these elements are electrically connected and adhered using an anisotropic conductive adhesion sheet. The anisotropic conductive adhesion sheet is prepared by molding a resin containing electrically conductive particles dispersed therein into the form of a sheet. The anisotropic conductive adhesion sheet has an electric conductivity in the adhesion direction, i.e., in the sheet thickness direction, but lacks electric conductivity in the in-plane directions of the adhesion surface. Therefore, the plurality of electrodes provided over the short-side surfaces of the piezoelectric element P5 can be electrically connected to the respective electric lines of the first and second flexible cables F51 and F52 by a single anisotropic conductive adhesion sheet with the electrodes being mutually insulated. In the first step of the connection method, an anisotropic conductive sheet is sandwiched between the first and second flexible cables F51 and F52 made of polyimide and the piezoelectric element P5. Then, the first and second flexible cables F51 and F52 are pressed against the piezoelectric element P5 using a heated planar cautery. As a result, the first and second flexible cables F51 and F52 and the piezoelectric element P5 are electrically coupled by the electrically conductive particles and adhered by means of the resin of the anisotropic conductive adhesion sheet.

The connection portions of the first and second flexible cables F51 and F52 and the piezoelectric element P5 are respectively interposed between the supporting portion 13*a* and the piezoelectric element P5 and between the supporting portion 13*c* and the piezoelectric element P5. Specifically, the first flexible cable F51 is pressed by the supporting portion 13*a* against the piezoelectric element P5. The second flexible cable F52 is pressed by the supporting portion 13*c* against the piezoelectric element P5.

The electric lines 6 connected to the power supply external electrodes 4 are an example of the power supply conductive member. The electric line 6A connected to the first power supply external electrode 4A is an example of the first power supply conductive member. The electric line 6B connected to the second power supply external electrode 4B is an example of the second power supply conductive member. The electric lines 7 connected to the counter external electrodes 5 are an example of the counter conductive member. The electric line 7A connected to the first counter external electrode 5A is an example of the first power supply conductive member. The electric line 7B connected to the second counter external electrode 5B is an example of the second counter conductive member. The first flexible cable F51 is an example of the first electrical connection member. The second flexible cable F52 is an example of the second electrical connection member.

The first and second flexible cables F51 and F52 are coupled to a power supply (not shown). A driving voltage from the power supply is applied to the piezoelectric element P5 via the first and second flexible cables F51 and F52 such that vibration is generated in the piezoelectric element P5.

5.3: Operation of Ultrasonic Actuator

Hereinafter, an operation of the ultrasonic actuator is described.

A first driving voltage at a frequency near the substantially-matched resonance frequencies of the stretching vibration and the bending vibration of the piezoelectric element P5 is applied between the first power supply electrode 2A and the first counter electrode 3A, and a second driving voltage which is approximately equal in amplitude and frequency to and different in phase by generally 90° or −90° from the first driving voltage is applied between the second power supply electrode 2B and the second counter electrode 3B, whereby the first mode stretching vibration and the second mode bending vibration are harmonically induced in the piezoelectric element P5. As a result, the piezoelectric element P5 vibrates with its shape being sequentially deformed in the order of FIG. 8(A), FIG. 8(B), FIG. 8(C), and FIG. 8(D). The driver elements 8 provided on the piezoelectric element P5 make a revolutionary movement, specifically a generally-elliptic movement, when seen in the direction perpendicular to the surface of the sheet of FIG. 8. In other words, the composite vibration of the stretching vibration and bending vibration of the piezoelectric element P5 causes the driver elements 8 to make an elliptic movement. Due to this elliptic movement, the movable element 9 on which the driver elements 8 abut moves relative to the piezoelectric element P5.

In this embodiment, the power supply applies to the first counter electrode 3A a voltage opposite in polarity to that applied to the first power supply electrode 2A. The power supply applies to the second counter electrode 3B a voltage opposite in polarity to that applied to the second power supply electrode 2B. This power supply may be implemented using a full-bridge circuit, a push-pull circuit, or the like. This structure is possible because the counter electrodes 3 include the first counter electrodes 3A and the second counter electrodes 3B which are separate from each other.

Although the first power supply external electrode 4A and the second power supply external electrode 4B are provided on one of the two short-side surfaces of the piezoelectric element P5 while the first counter external electrode 5A and the second counter external electrode 5B are provided on the other one of the two short-side surfaces, any combination of these electrodes may be possible. The structure in which the first power supply external electrode 4A is provided on one of the two short-side surfaces of the piezoelectric element P5 while the first counter external electrode 5A is provided on the other one of the two short-side surfaces and in which the second power supply external electrode 4B is provided on one of the two short-side surfaces of the piezoelectric element P5 while the second counter external electrode 5B is provided on the other one of the two short-side surfaces may be implemented by an alternative structure in which both the first power supply external electrode 4A and the second counter external electrode 5B are provided on one of the two short-side surfaces of the piezoelectric element P5 while both the first counter external electrode 5A and the second power supply external electrode 4B are provided on the other one of the two short-side surfaces.

Both the first counter electrodes 3A and the second counter electrodes 3B may be coupled to the ground.

Although the above-described example uses one piece of the piezoelectric element P5 which is coupled to the power supply, two or more pieces of the piezoelectric elements P5 may be used and may be connected in series and coupled to the power supply. In this case, for example, the serial connection may be implemented by electrically coupling the second counter external electrode 5B of the first piezoelectric element P5 to the second power supply external electrode 4B of the second piezoelectric element P5 using an electrical connection member, such as a flexible, or the like, and electrically coupling the first counter external electrode 5A of the first piezoelectric element P5 to the first power supply external electrodes 4A of the second piezoelectric element P5 using an electrical connection member, such as a flexible, or the like.

5.4: Advantages of Embodiment

According to this embodiment, as in embodiment 2, the first power supply external electrode 4A and the counter external electrodes 5 are provided at different short-side surfaces of the piezoelectric element P5, and the second power supply external electrode 4B and the counter external electrodes 5 are provided at different short-side surfaces. This configuration ensures a sufficient distance between the first power supply external electrode 4A and the counter external electrodes 5 and between the second power supply external electrode 4B and the counter external electrodes 5. Accordingly, sufficient insulation can be ensured between the first power supply external electrode 4A and the counter external electrodes 5 and between the second power supply external electrode 4B and the counter external electrodes 5.

Since the counter electrodes 3 include the first counter electrodes 3A and the second counter electrodes 3B which are separate from each other, a voltage opposite in polarity to that applied to the first power supply electrodes 2A can be applied to the first counter electrodes 3A, and a voltage opposite in polarity to that applied to the second power supply electrodes 2B can be applied to the second counter electrodes 3B. Therefore, the voltage applied to the piezoelectric layer 1 can be twice that applied when the counter electrodes 3 are coupled to the ground. Further, due to this configuration, a plurality of pieces of the piezoelectric elements P5 can be connected in series as described above.

The first power supply external electrode 4A is provided on one of the two short-side surfaces of the piezoelectric element, and the first counter external electrode 5A is provided on the other one of the two short-side surfaces which is different from that on which the first power supply external electrode 4A is provided. This configuration ensures a large distance between the first power supply external electrode 4A and the first counter external electrode 5A. This configuration also improves insulation between the first power supply external electrode 4A and the first counter external electrode 5A. Likewise, the second power supply external electrode 4B is provided on one of the two short-side surfaces of the piezoelectric element, and the second counter external electrode 5B is provided on the other one of the two short-side surfaces which is different from that on which the second power supply external electrode 4B is provided. This configuration ensures a large distance between the second power supply external electrode 4B and the second counter external electrode 5B. This configuration also improves insulation between the second power supply external electrode 4B and the second counter external electrode 5B.

The principal surface of the piezoelectric layer 1 on which the first counter electrodes 3A are provided has the third connection electrode J3 which provides electrical connection between the first counter electrodes 3A. The principal surface of another piezoelectric layer 1, which is different from the principal surface that has the third connection electrode J3 thereon, has the fourth connection electrode J4 which provides electrical connection between the second counter electrodes 3B. This configuration enables reduction of the number of the first counter external electrodes 5A which are electrically coupled to the first counter electrodes 3A and the number of the second counter external electrodes 5B which are electrically coupled to the second counter electrodes 3B. As a result, the number of connection points between the piezoelectric element P5 and the electrical connection members can be reduced, and accordingly, the probability of occurrence of peeling at the connection faces between the piezoelectric element P5 and the electrical connection members. Further, the factors of interference with the vibration of the piezoelectric element P5 are decreased so that the efficiency of the vibration can be improved.

The third and fourth connection electrodes J3 and J4 have a shape elongated in the lateral direction at the longitudinal center of the principal surface of the piezoelectric layer 1. Therefore, the counter electrodes 3 can have an increased area at the longitudinal center of the piezoelectric layer 1. By increasing the areas of the third and fourth connection electrodes J3 and J4, large stretching vibration can be induced even when the size of the piezoelectric element P5 is reduced. As a result, the efficiency of the ultrasonic actuator can be improved.

Embodiment 5 can also provide effects and advantages substantially equivalent to those of embodiments 1 and 2.

Other Embodiments

According to the present invention, the above-described embodiments may have different structures which are described below.

The shape of the driver elements 8 is not limited to the shape of a circular pole. It may be the shape of a sphere or a square pole. The driver elements preferably have a spherical shape because in this case the driver elements and the piezoelectric element P1 are fixedly in point contact with each other.

The electrical connection members are not limited to the flexible cables. For example, wires, contact pins, conductive rubbers, etc., may be used. The above-described connection with the anisotropic conductive adhesive sheet may be replaced by a different electrical connection method, for example, connection with a low-melting metal, such as soldering, connection by wire bonding, connection with a non-anisotropic conductive adhesive sheet, connection with a conductive adhesive, such as a liquid adhesive, connection by pressing, etc. The conductive rubbers may have a layered structure which includes a supporting layer made of, for example, silicone rubber as a principal constituent, and a conductive layer containing silicone rubber and metal particles of silver, or the like, and may be anisotropic so that it is nonconducting in the stacking direction. One of the short-side surfaces of the piezoelectric element may be provided with one piece of the conductive rubber or may be provided with two pieces of the conductive rubber. In the case of using the conductive rubber, the conductive rubber may be used as the supporting portions 13*a* and 13*c*. In the case where one of the short-side surfaces of the piezoelectric element is provided with one piece of the conductive rubber, the non-conductive property of the conductive rubber in the stacking direction is utilized to provide insulation of the power supply external electrodes 4 and the counter external electrodes 5, specifically insulation between the first power supply external electrode 4A and the second power supply external electrode 4B, and insulation between a first counter external electrode 5A and a second counter external electrode 5B. In this case, the respective conductive layers function as any of the first power supply conductive member 6A, the second power supply conductive member 6B, the first counter conductive member 7A, and the second counter conductive member 7B.

The first connection electrode J1 and the second connection electrode J2 are provided at the longitudinal center of the principal surface of the piezoelectric layer 1 and have a shape elongated in a direction generally perpendicular to the short sides of the principal surface of the piezoelectric layer 1. More preferably, as for the dimensions in the direction of the long sides of the piezoelectric layer 1, the width of the first connection electrode J1 and the second connection electrode J2 is preferably about 5% to 40% of the length of the long sides of the piezoelectric layer 1. This is because, although a greater stretching vibration occurs as the electrode areas of the first connection electrode J1 and the second connection electrode J2 increase, the second mode bending vibration would be interrupted if the electrode areas are excessively large. On the other hand, as for the dimensions in the direction of the short sides of the piezoelectric layer 1, the first connection electrode J1 and the second connection electrode J2 should ideally be provided over the entire short sides. However, if the first connection electrode J1 and the second connection electrode J2 reach the edges of the piezoelectric layer 1 at its lateral ends, it is difficult to provide insulation between the internal electrode layers. As such, the first connection electrode J1 and the second connection electrode J2 are preferably provided over the principal surface of the piezoelectric layer 1 except for the edges of the principal surface at its lateral ends. Specifically, the first connection electrode J1 and the second connection electrode J2 are desirably provided over the entire principal surface of the piezoelectric layer 1 except for a region extending from the respective edges of the principal surface of the piezoelectric layer 1 at its lateral ends toward the lateral center by the distance equal to the thickness of the piezoelectric layer 1. This applies to the third connection electrode J3 and the fourth connection electrode J4 of embodiment 5.

The number of power supply electrodes 2 of the first pattern and the number of power supply electrodes 2 of the second pattern are preferably equal although they may not be equal. The power supply electrodes 2 of the first pattern and the power supply electrodes 2 of the second pattern are preferably alternately provided although they may not be alternately provided. In embodiment 5, the number of counter electrodes 3 of the third pattern and the number of counter electrodes 3 of the fourth pattern are preferably equal although they may not be equal. The counter electrodes 3 of the third pattern and the counter electrodes 3 of the fourth pattern are preferably alternately provided although they may not be alternately provided. This alternate arrangement improves the symmetry of vibration of the piezoelectric element. Also, the alternate arrangement prevents generation of excessive vibration in the piezoelectric element so that the energy loss can be greatly reduced.

The power supply electrodes 2 and counter electrodes 3 are preferably configured so as not to be exposed on the principal surface of the piezoelectric element although they may be exposed thereon. When the power supply electrodes 2 and counter electrodes 3 are not exposed on the principal surface of the piezoelectric element which has a larger area among the external surfaces of the piezoelectric element, the probability of occurrence of short circuits with peripheral metal parts decreases.

The region where the power supply electrodes 2 and the counter electrodes 3 are not overlapping when seen in the stacking direction is more preferably a region extending from the respective edges of the piezoelectric layer 1 at its longitudinal ends toward the longitudinal center by the distance equal to or greater than 10% of the longitudinal dimension of the piezoelectric layer 1. The region where the power supply electrodes 2 and the counter electrodes 3 are not overlapping when seen in the stacking direction is preferably a region extending from the respective edges of the piezoelectric layer 1 at its longitudinal ends toward the longitudinal center by the distance equal to or greater than 20% of the longitudinal dimension of the piezoelectric layer 1. In this case, near the edges of the piezoelectric layer 1 at its longitudinal ends, only a small stress is created under the first mode stretching vibration. Also, the connection between the short-side surfaces of the piezoelectric element and the electrical connection members can be less affected.

Figure 21:
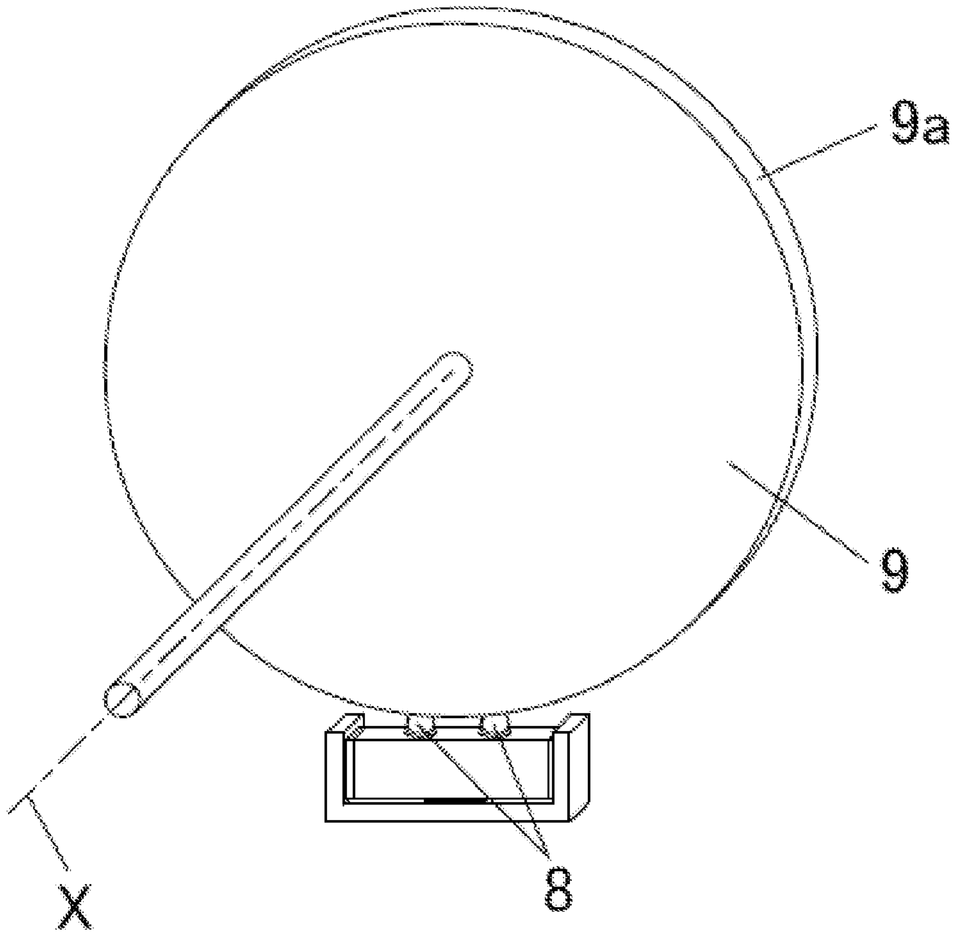
FIG. 21 shows another ultrasonic actuator embodiment.

In the above-described embodiments, the movable element 9 which is driven by applying a driving force from the ultrasonic actuator is in the shape of a flat plate, to which the present invention is not limited. Any structure may be adopted as the structure of the movable element 9. For example, as shown in FIG. 21, the movable element may be a circular disk 9 which is rotatable around a predetermined axis X, with the driver elements 8 of the ultrasonic actuator abutting the circumferential surface 9*a* of the circular disk 9. In the case of this structure, when the ultrasonic actuator is driven, the driver elements 8 make a generally-elliptic movement, and accordingly, the circular disk 9 is rotated around the predetermined axis X. Part of the mechanism including the piezoelectric element may be stationary or may be movable.

In the above-described embodiments, the supporting body is formed by the case 11 but may be formed by any structure.

The voltage applied to the second power supply electrode 2B is different in phase from the reference voltage applied to the first power supply electrode 2A by generally +90 degrees or by generally −90 degrees, to which however the present invention is not limited. A voltage of a different phase difference from the reference voltage may be applied. Also, the voltage may be applied to only one of the first power supply electrode 2A and the second power supply electrode 2B.

Figure 22:
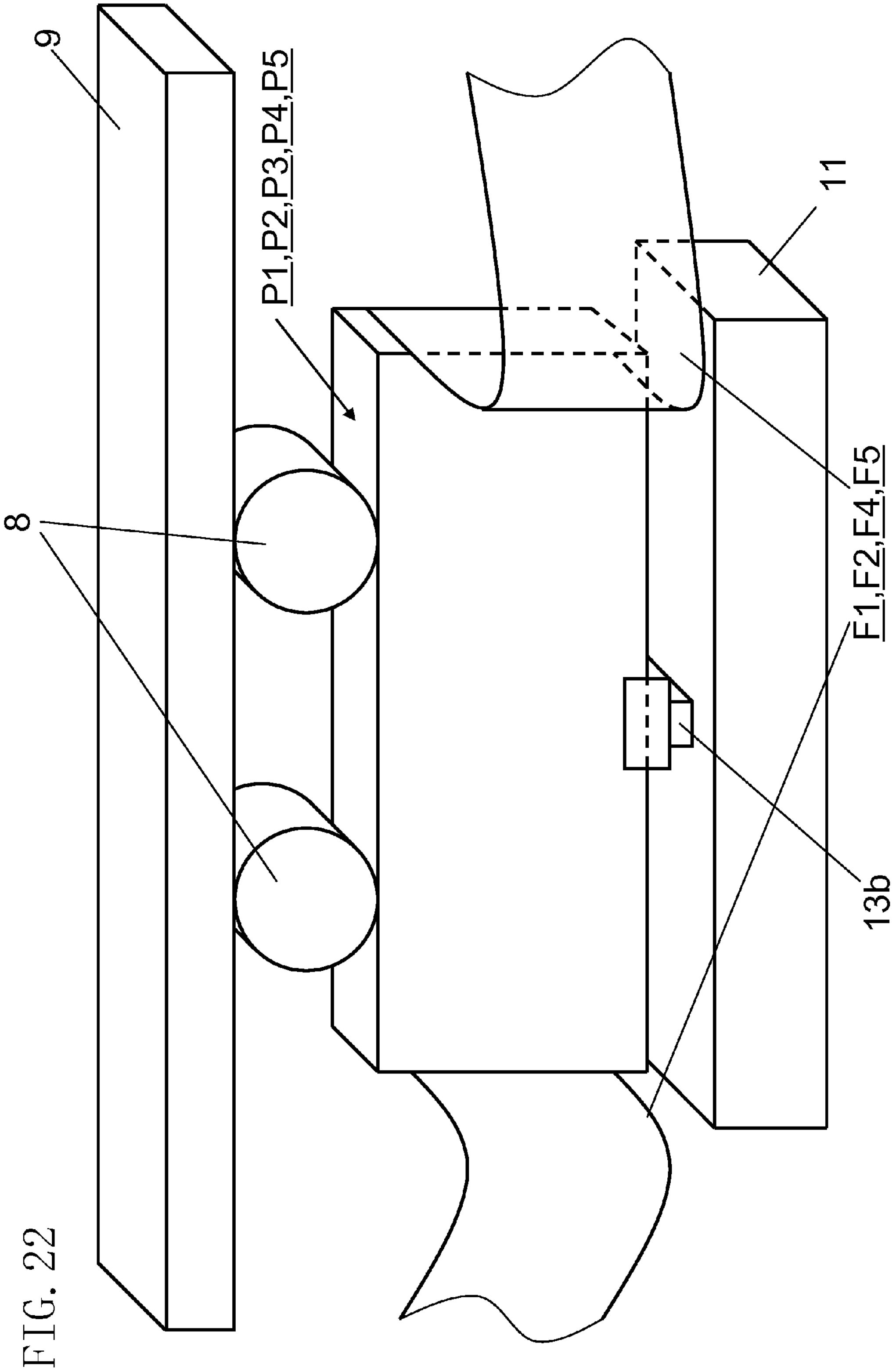
FIG. 22 shows still another ultrasonic actuator embodiment.

In the above-described embodiments, the ultrasonic actuator is supported using the supporting portions 13*a*, 13*b* and 13*c*. However, the present invention is not limited to this example. For example, as shown in FIG. 22, only the supporting portion 13*b* is provided on one of the two long-side surfaces of the piezoelectric element on which the driver elements are not provided. This supporting portion 13*b* restricts the movement of the piezoelectric element in the driving direction (the long-side direction of the principal surface) and allows the movement of the driver elements in a direction in which the driver elements abut the movable element 9 (the short-side direction of the principal surface). The supporting portion 13*b* generates a pressing force in a direction in which the driver elements abut the movable element and increases the frictional force between the driver elements and the movable element.

The present invention is not limited to the above-described embodiments and can be implemented in various other forms without departing from the spirit of the invention. The embodiments are merely exemplary in all aspects and should not be construed as limiting. The scope of the invention is defined only by claims and is not restricted by the specification. Variations and modifications equivalent to the claimed inventions are all within the scope of the present invention.

INDUSTRIAL APPLICABILITY

The present invention is applicable to a highly-reliable ultrasonic actuator, for example, a driving force generator which is for use in a variety of electronic devices and other types of devices.

What is claimed is:

1. An ultrasonic actuator, comprising:

a piezoelectric element; and a flexible cable electrically connected to the piezoelectric element, wherein the piezoelectric element includes a plurality of generally rectangular piezoelectric layers, a power supply electrode provided on a principal surface of at least one of the plurality of piezoelectric layers, a counter electrode provided to face the power supply electrode with the piezoelectric layer interposed therebetween, a power supply external electrode provided on one of external surfaces of the piezoelectric element which is perpendicular to the principal surface of the piezoelectric layer, and which is parallel to short sides of the principal surface, the power supply external electrode being electrically coupled to the power supply electrode, and a counter external electrode provided on one of the external surfaces of the piezoelectric element which is perpendicular to the principal surface of the piezoelectric layer, and which is parallel to the short sides of the principal surface, the counter external electrode being electrically coupled to the counter electrode, the flexible cable includes a power supply conductive member electrically connected to the power supply external electrode, and a counter conductive member electrically connected to the counter external electrode, the power supply electrode includes a first power supply electrode provided on the principal surface of the at least one of the plurality of piezoelectric layers, and a second power supply electrode provided on the principal surface which has the first power supply electrode thereon or on a principal surface of another one of the piezoelectric layers which is different from the principal surface that has the first power supply electrode thereon, the second power supply electrode being not electrically coupled to the first power supply electrode, the power supply external electrode includes a first power supply external electrode provided on the one of the external surfaces of the piezoelectric element which is perpendicular to the principal surface of the piezoelectric layer, and which is parallel to the short sides of the principal surface, the first power supply external electrode being electrically coupled to the first power supply electrode, and a second power supply external electrode provided on the one of the external surfaces of the piezoelectric element which is perpendicular to the principal surface of the piezoelectric layer, and which is parallel to the short sides of the principal surface, the second power supply external electrode being electrically coupled to the second power supply electrode, and the power supply conductive member includes a first power supply conductive member electrically connected to the first power supply external electrode, and a second power supply conductive member electrically connected to the second power supply external electrode, the counter electrode includes a first counter electrode provided to face the first power supply electrode with the piezoelectric layer interposed therebetween, and a second counter electrode provided to face the second power supply electrode with the piezoelectric layer interposed therebetween, the second counter electrode being not electrically coupled to the first counter electrode, the counter external electrode includes a first counter external electrode electrically coupled to the first counter electrode, and a second counter external electrode electrically coupled to the second counter electrode, and the counter conductive member includes a first counter conductive member electrically connected to the first counter external electrode, and a second counter conductive member electrically connected to the second counter external electrode.

2. The ultrasonic actuator of claim 1, wherein the first power supply electrode is provided in two of four divisional regions of the principal surface of the piezoelectric layer which are defined by halving the principal surface with respect to its longitudinal and lateral directions, the two divisional regions being aligned in a first diagonal direction of the principal surface of the piezoelectric layer, and the second power supply electrode is provided in two of the four divisional regions of the principal surface of the piezoelectric layer which are defined by halving the principal surface with respect to its longitudinal and lateral directions, the two divisional regions being aligned in a second diagonal direction of the principal surface of the piezoelectric layer.

3. The ultrasonic actuator of claim 1, wherein the power supply electrode includes a first connection electrode which is provided on the principal surface of the piezoelectric layer that has the first power supply electrode thereon, and which electrically connects the first power supply electrodes provided in the two of the four divisional regions aligned in the first diagonal direction, and a second connection electrode which is provided on the principal surface of the piezoelectric layer that has the second power supply electrode thereon and that is different from the piezoelectric layer having the first power supply electrode thereon, and which electrically connects the second power supply electrodes provided in the two of the four divisional regions aligned in the second diagonal direction.

4. The ultrasonic actuator of claim 3, wherein the first counter electrode is provided in the two of the four divisional regions of the principal surface of the piezoelectric layer which are defined by halving the principal surface with respect to its longitudinal and lateral directions, the two divisional regions being aligned in the first diagonal direction of the principal surface of the piezoelectric layer, and the second counter electrode is provided in the two of the four divisional regions of the principal surface of the piezoelectric layer which are defined by halving the principal surface with respect to its longitudinal and lateral directions, the two divisional regions being aligned in the second diagonal direction of the principal surface of the piezoelectric layer.

5. The ultrasonic actuator of claim 4, wherein the counter electrode includes a third connection electrode which is provided on the principal surface of the piezoelectric layer that has the first counter electrode thereon, and which is configured to electrically connect the first counter electrodes provided in the two of the four divisional regions aligned in the first diagonal direction, and a fourth connection electrode which is provided on the principal surface of the piezoelectric layer that has the second counter electrode thereon and that is different from the piezoelectric layer having the first counter electrode thereon, and which is configured to electrically connect the second counter electrodes provided in the two of the four divisional regions aligned in the second diagonal direction.

6. The ultrasonic actuator of claim 5, wherein the first power supply external electrode and the second power supply external electrode are provided on one of two external surfaces of the piezoelectric element which are perpendicular to the principal surface of the piezoelectric layer, and which are parallel to the short sides of the principal surface, and the first counter external electrode and the second counter external electrode are provided on the other one of the two external surfaces of the piezoelectric element which are perpendicular to the principal surface of the piezoelectric layer, and which are parallel to the short sides of the principal surface.

7. The ultrasonic actuator of claim 5, wherein the third connection electrode and the fourth connection electrode are provided at a longitudinal center of the principal surface of the piezoelectric layer, and have a shape elongated in a direction generally parallel to the short sides of the principal surface of the piezoelectric layer.

* * * * *